(12) United States Patent
Fukui

(10) Patent No.: US 10,048,295 B2
(45) Date of Patent: Aug. 14, 2018

(54) CURRENT SENSOR

(71) Applicant: ALPS ELECTRIC CO., LTD., Tokyo (JP)

(72) Inventor: Hirofumi Fukui, Miyagi-ken (JP)

(73) Assignee: Alps Electric Co., Ltd., Tokyo (JP)

(*) Notice: Subject to any disclaimer, the term of this patent is extended or adjusted under 35 U.S.C. 154(b) by 340 days.

(21) Appl. No.: 15/050,111

(22) Filed: Feb. 22, 2016

(65) Prior Publication Data

US 2016/0169941 A1 Jun. 16, 2016

Related U.S. Application Data

(63) Continuation of application No. PCT/JP2014/070837, filed on Aug. 7, 2014.

(30) Foreign Application Priority Data

Aug. 29, 2013 (JP) .................................. 2013-177620

(51) Int. Cl.
*G01R 33/02* (2006.01)
*G01R 15/20* (2006.01)

(52) U.S. Cl.
CPC .................................. *G01R 15/207* (2013.01)

(58) Field of Classification Search
CPC ...... G01R 33/02; G01R 33/093; G01R 33/09; G01R 15/207; G01R 19/0092;
(Continued)

(56) References Cited

U.S. PATENT DOCUMENTS 3,360,727 A * 12/1967 Justice .................. G01R 19/22
324/119
3,663,957 A * 5/1972 Mollenbeck ......... G01R 15/246
324/96
(Continued)

FOREIGN PATENT DOCUMENTS

EP 1037056 9/2000
JP 2001-066237 3/2001
(Continued)

OTHER PUBLICATIONS

Search Report dated Nov. 25, 2014 from PCT/JP2014/070837.
(Continued)

*Primary Examiner* — Jermele M Hollington
*Assistant Examiner* — Taqi Nasir
(74) *Attorney, Agent, or Firm* — Beyer Law Group LLP

(57) ABSTRACT

A current sensor includes magneto-electric conversion elements divided into a first and second group. The first and second groups are positioned so as to interpose a cut formed in a printed circuit board between them. The first and second groups are symmetrically positioned with respect to a first virtual line. The magneto-electric conversion elements in the first and second groups are symmetrically positioned with respect to a second virtual line orthogonal to the first virtual line at a positioning position at which a to-be-measured current path is positioned. The sensitivity axes of each of pairs of magneto-electric conversion elements that are symmetrical with respect to the positioning position are oriented in parallel in the same direction or opposite directions. An inter-element spacing between adjacent magneto-electric conversion elements in the first and second groups is narrower than an inter-group spacing, which is the narrowest spacing between the first and second groups.

11 Claims, 17 Drawing Sheets

(58) Field of Classification Search
CPC .... G01R 33/096; G01R 15/20; G01R 15/202; G01R 15/18; G01R 15/186; G01R 33/18; G01R 15/183; H01L 2924/30107; H01L 23/3107; G01N 27/72; G01N 27/82; G11B 5/39; G01B 7/10; G01V 3/10
USPC ... 324/117 R, 117 H, 244, 252, 126, 756.01, 324/127, 115, 149, 246, 260, 262, 263, 324/253
See application file for complete search history.

(56) References Cited

U.S. PATENT DOCUMENTS

| | | | | |
|---|---|---|---|---|
| 4,786,870 | A | * 11/1988 | Kawamata | ............. G01D 5/145 324/207.21 |
| 5,898,303 | A | * 4/1999 | Umanskiy | ............. G01R 31/041 228/104 |
| 6,717,397 | B2 | 4/2004 | Sorenson, Jr. | |
| 6,822,443 | B1 | * 11/2004 | Dogaru | ............. G01R 33/093 324/235 |
| 7,164,263 | B2 | 1/2007 | Yakymyshyn | |
| 7,230,413 | B2 | * 6/2007 | Zhang | ............. G01R 15/181 324/117 R |
| 2004/0124836 | A1 | * 7/2004 | Kang | ............. G01R 33/045 324/253 |
| 2009/0121704 | A1 | 5/2009 | Shibahara | |
| 2011/0025321 | A1 | * 2/2011 | Yamazaki | ............. G01D 5/145 324/252 |
| 2011/0221434 | A1 | * 9/2011 | Nishiyama | ........... G01R 15/205 324/252 |
| 2013/0099775 | A1 | * 4/2013 | Mitsuya | ............... G01R 15/207 324/126 |
| 2013/0106400 | A1 | * 5/2013 | Cheng | .................... G01R 15/20 324/117 R |
| 2013/0300404 | A1 | 11/2013 | Hebiguchi | |
| 2014/0070801 | A1 | * 3/2014 | Tamura | .................. G01R 15/20 324/244 |
| 2014/0320122 | A1 | * 10/2014 | Fukui | ................. G01R 19/0092 324/244 |

FOREIGN PATENT DOCUMENTS

| | | | |
|---|---|---|---|
| JP | 2007-107972 | 4/2007 | |
| JP | 2007107872 A | * 4/2007 | ............ G01R 15/20 |
| JP | 5747212 B | 5/2015 | |
| WO | 2013/051566 | 4/2013 | |
| WO | 2013/128993 | 6/2013 | |

OTHER PUBLICATIONS

Search Report dated May 7, 2013 from International Application No. PCT/JP2013/051535.
Office Action dated Nov. 20, 2015 from U.S. Appl. No. 14/327,182.
Final Office Action dated Mar. 3, 2016 from U.S. Appl. No. 14/327,182.

* cited by examiner

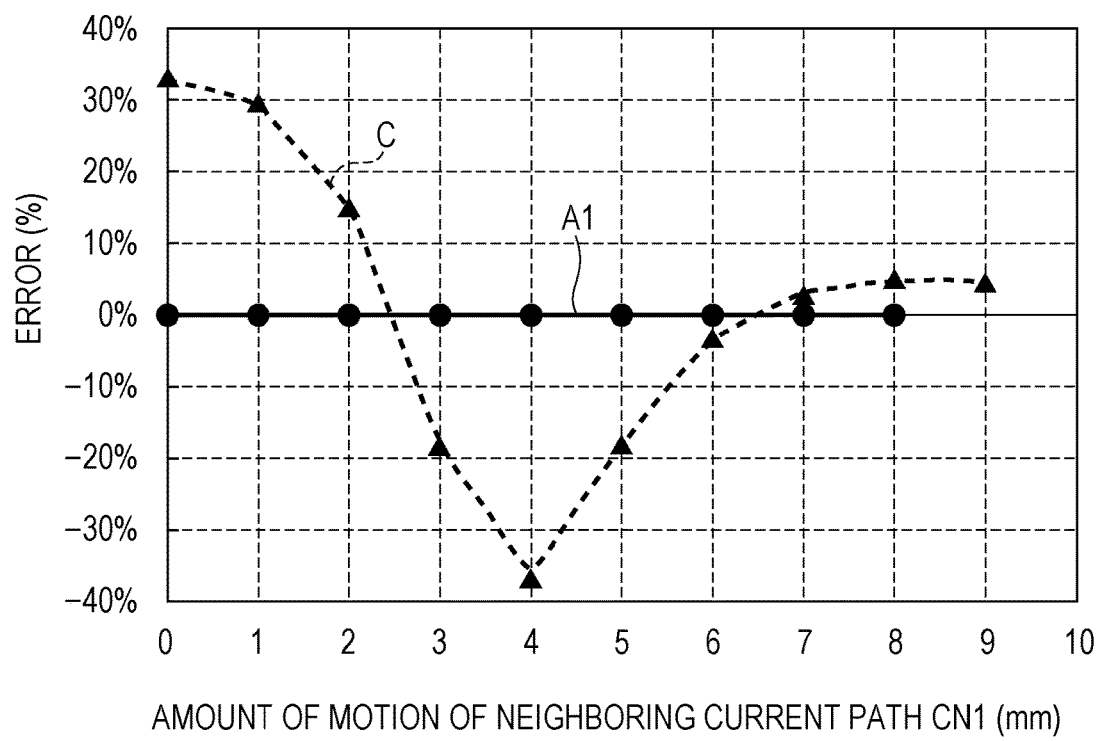

← SENSITIVITY AXIS
← SENSITIVITY AFFECTING AXIS

PRIOR ART

AMOUNT OF MOTION OF NEIGHBORING CURRENT PATH CN1 (mm)

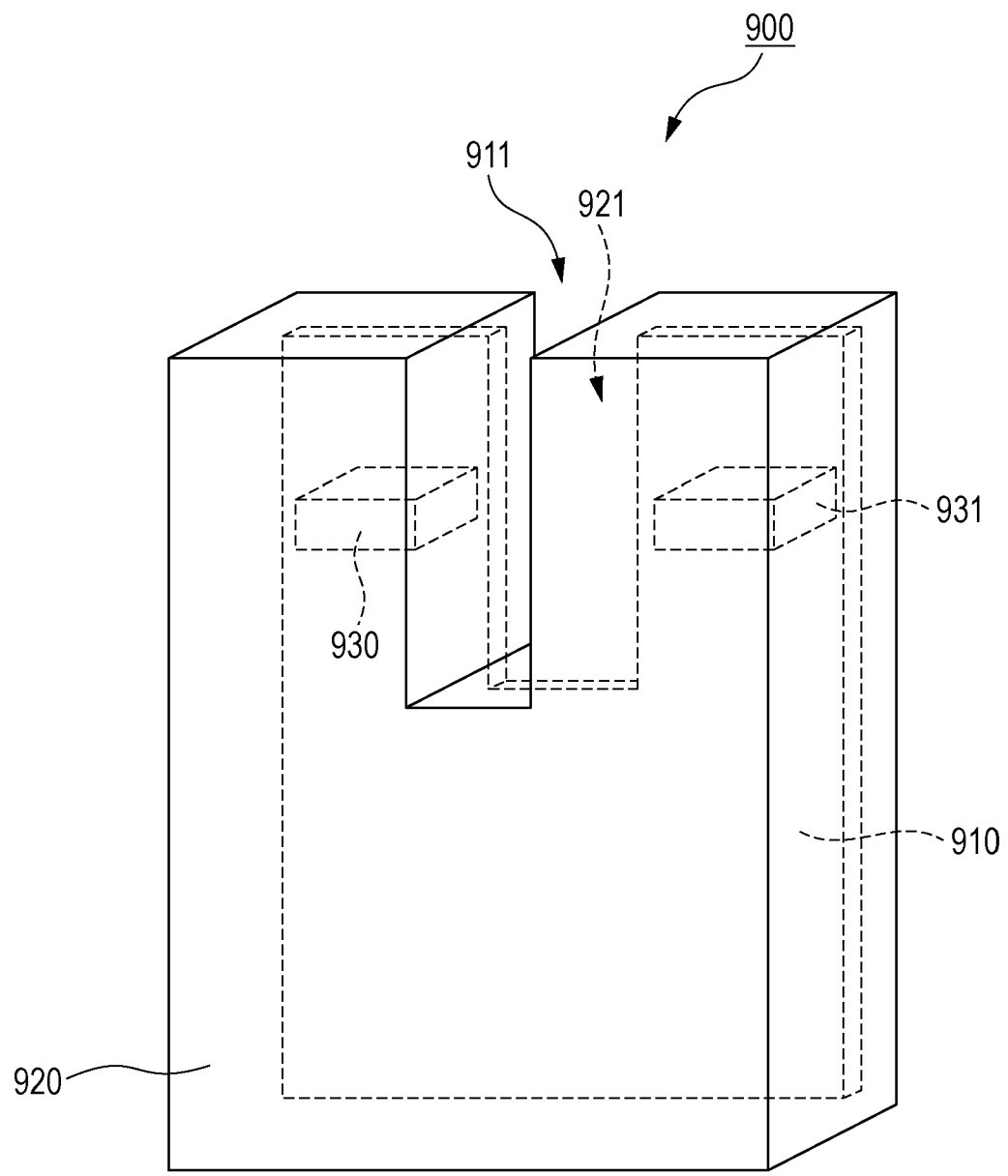

CURRENT SENSOR

CLAIM OF PRIORITY

This application is a Continuation of International Application No. PCT/JP2014/070837 filed on Aug. 7, 2014, which claims benefit of Japanese Patent Application No. 2013-177620 filed on Aug. 29, 2013. The entire contents of each application noted above are hereby incorporated by reference.

BACKGROUND OF THE INVENTION

1. Field of the Invention

The present invention relates to a current sensor that detects a current flowing in a to-be-measured current path, and more particularly to a current sensor that detects a current flowing in a to-be-measured current path by using magneto-electric conversion elements.

2. Description of the Related Art

To control or monitor an electronic device, a well-known current sensor is attached to a to-be-measured current path to detect a current flowing in the current path. As this type of current sensor, a current sensor that uses magneto-electric conversion elements such as Hall elements or magneto-resistive elements is known. It is known that a plurality of elements are used to improve the sensitivity of the magneto-electric conversion elements and reduce adverse effects by external magnetic fields.

A current sensor 900, which is an proposed conventional current sensor, has a concave cut into which a to-be-measured current path (not illustrated) is interposed, as illustrated in FIG. 17 (see Japanese Unexamined Patent Application Publication No. 2001-066327). FIG. 17 is a perspective view that schematically illustrates the structure of the current sensor 900 described in Japanese Unexamined Patent Application Publication No. 2001-066327. The current sensor 900 in FIG. 17 has a case 920 that has a concave cut 911 in which a to-be-measured current path is interposed, a circuit board 910 having a cut 921, the circuit board 910 being placed in the case 920, and magneto-electric conversion elements (here, Hall elements) 930 and 931 that output electronic signals according to the intensity of a magnetic filed generated by a current flowing in a conductor placed in the vicinity of the concave cut 911. Thus, the current sensor 900 that can be made compact and easy-to-integrate can be provided.

Another known current sensor has four magnetic impedance elements that are oppositely placed, centered around an electric wire holder, which holds an electric wire (see EP1037056 A1). This current sensor has an arc-shaped opening, which works as the electric wire holder, at an engagement portion of a case having a convex part and a concave part. On the concave part side of the case, the four magnetic impedance elements are oppositely placed around the opening in its circumferential direction so as to be equally spaced.

To achieve higher measurement precision than in the above conventional technologies described in Japanese Unexamined Patent Application Publication No. 2001-066327 and EP1037056 A1, current sensors having more magneto-electric conversion elements can be contemplated. FIGS. 13A and 13B are plan views of current sensors in comparative examples. FIG. 13A illustrates a current sensor according to a first comparative example, in which eight magneto-electric conversion elements C15 are positioned at positions at which they surround a to-be-measured current path CB. FIG. 13B illustrates a current sensor according to a second comparative example, in which six magneto-electric conversion elements C25 are positioned at positions at which they surround the to-be-measured current path CB. To simplify an explanation, only the to-be-measured current path CB, neighboring current paths CN, and the magneto-electric conversion elements C15 and C25 are illustrated.

As illustrated in FIGS. 13A and 13B, the current sensors in the comparative examples each have a plurality of magneto-electric conversion elements (C15 or C25) positioned on a circumference centered on the center of the to-be-measured current path CB in a plan view; each two adjacent magneto-electric conversion elements (C15 or C25) are spaced at the same angular interval. Specifically, the magneto-electric conversion elements C15 of the current sensor in the first comparative example in FIG. 13A are placed at the vertexes of a regular octagon. The magneto-electric conversion elements C25 of the current sensor in the second comparative example in FIG. 13B are placed at the vertexes of a regular hexagon. Thus, even if the position of the to-be-measured current path CB is shifted a little, when detected values from the magneto-electric conversion elements (C15 and C25) are added, it is possible to prevent measurement precision from being easily lowered.

SUMMARY OF THE INVENTION

With the current sensors in the first comparative example and second comparative example described above, however, the to-be-measured current path CB needs to be positioned at the central position of a circumference by being passed through a spacing between magneto-electric conversion elements (C15 or C25), so an inter-element spacing (DC1 or DC2) between each two magneto-electric conversion elements (C15 or C25) is determined according to the size of the to-be-measured current path CB. That is, the position of a vertex of a regular octagon or a regular hexagon centered on the positioning position of the to-be-measured current path CB is necessarily determined as a position at which one magneto-electric conversion element is positioned. This has been problematic in that the inter-element spacing between each two magneto-electric conversion elements needs to be large enough for the to-be-measured current path CB to pass through and thereby the size of the current sensor cannot be further reduced. Another problem has been that since the inter-element spacings (DC1 and DC2) are expanded to a spacing enough for the to-be-measured current path CB to enter, if adjacent neighboring current paths CN are present, adverse effects by external magnetic fields caused by the neighboring current paths CN arise and stable detected values cannot be obtained from the magneto-electric conversion elements (C15 and C25).

In a highly sensitive magneto-electric conversion element, an axis (referred to below as the sensitivity affecting axis) that affects detection sensitivity may be generated in a direction orthogonal to a sensitivity axis. In a current sensor having highly sensitive magneto-electric conversion elements of this type, if a magneto-electric conversion element is placed so that its sensitive axis has a predetermined angle with respect to the direction of an induced magnetic field from a current under measurement, not only an output signal based on an induced magnetic field applied from the direction of the sensitive axis but also an induced magnetic field applied from the direction of the sensitivity affecting axis may affect measurement precision. For example, detection sensitivity itself in the direction of the sensitive axis may be affected due to the induced magnetic field applied from the direction of the sensitivity affecting axis and sensitivity may thereby change. An output signal due to the induced magnetic field applied from the direction of the sensitivity affecting axis may also change measurement sensitivity. A change in sensitivity that occurs in this way becomes a factor that lowers the detection sensitivity of the current sensor.

The present invention addresses the above problems by providing a current sensor that can be made compact and from which stable detected values can be obtained.

The current sensor in the present invention can also suppress a detection precision drop attributable to the sensitivity affecting axis of a magneto-electric conversion element.

In the present invention, the sensitive axis is in the magnetic field direction in which sensitivity in the detection of the magnetic field is maximized. The sensitivity affecting axis is in a magnetic field direction that is orthogonal to the sensitivity direction and affects detection sensitivity.

To address the above problems, the current sensor in the present invention is characterized in that the current sensor has, on a printed circuit board, a plurality of magneto-electric conversion elements that detect a magnetism generated by a current flowing in a to-be-measured current path, each magneto-electric conversion element having a sensitivity axis and a sensitivity affecting axis that affects the detection sensitivity of the sensitivity axis, the sensitivity affecting axis being orthogonal to the sensitivity axis.

A cut with a width equal to or larger than the width of the to-be-measured current path is formed in the printed circuit board; the plurality of magneto-electric conversion elements are symmetrically positioned with respect to a first virtual line that extends in a direction in which the cut is formed so that the first virtual line passes through a positioning position at which the to-be-measured current path is positioned; the plurality of magneto-electric conversion elements are symmetrically positioned with respect to a second virtual line that is orthogonal to the first virtual line at the positioning position of the to-be-measured current path; the plurality of magneto-electric conversion elements are divided into a first magneto-electric conversion element group and a second magneto-electric conversion element group, the first magneto-electric conversion element group and the second magneto-electric conversion element group each including an equal number of magneto-electric conversion elements; the first magneto-electric conversion element group and the second magneto-electric conversion element group face each other so as to interpose the first virtual line therebetween; an inter-element spacing between each two adjacent magneto-electric conversion elements in the first magneto-electric conversion element group and in the second magneto-electric conversion element group is narrower than an inter-group spacing, which is the narrowest spacing between the first magneto-electric conversion element group and the second magneto-electric conversion element group; the sensitivity axes of each pair of magneto-electric conversion elements at point-symmetric positions with respect to the positioning position of the to-be-measured current path are orientated in parallel; if the sensitivity axes of the pair of the magneto-electric conversion elements at the point-symmetric positions are oriented in the same direction, the sensitivity affecting axes of the pair of the magneto-electric conversion elements at the point-symmetric positions are also oriented in the same direction; if the sensitivity axes of the pair of magneto-electric conversion elements at the point-symmetric positions are oriented in opposite directions, the sensitivity affecting axes of the pair of magneto-electric conversion elements at the point-symmetric positions are also oriented in opposite directions; the sensitivity axes of the magneto-electric conversion elements at an end of the first magneto-electric conversion element group and an end of the second magneto-electric conversion element group are orientated in parallel to the second virtual line; and the sensitivity axes of the magneto-electric conversion elements at other than the ends of the first magneto-electric conversion element group and second magneto-electric conversion element group are oriented in parallel to the first virtual line.

In this structure, the first magneto-electric conversion element group and second magneto-electric conversion element group are symmetrically positioned with respect to the first virtual line on a printed circuit board having a cut, into which a to-be-measured current path inserted and at which it is positioned, so as to interpose the cut therebetween. Therefore, a space in which magneto-electric conversion elements are positioned can be reduced in the direction of the second virtual line, in spite of the placement of the magneto-electric conversion elements in which a to-be-measured current path is inserted and positioned, when compared with a case in which magneto-electric conversion elements are positioned on a circumference so as to be equally spaced. Furthermore, since the inter-element spacing between each two adjacent magneto-electric conversion elements in the first magneto-electric conversion element group and second magneto-electric conversion element group is smaller than the inter-group spacing between the first magneto-electric conversion element group and the second magneto-electric conversion element group, the inter-element spacing between each two adjacent magneto-electric conversion elements can be narrowed in the same magneto-electric conversion element group when compared with a case in which magneto-electric conversion elements are placed on a circumference so as to be equally spaced. Therefore, even if magneto-resistive effect elements, which are affected by a magnetic field in a direction orthogonal to the sensitivity axis, are used, adverse effects by external magnetic field from another current path positioned at a position adjacent to the to-be-measured current path can be reduced, so adverse effect on the magneto-electric conversion elements by the external magnetic fields can be reduced. Particularly, if a plurality of current paths are positioned at small spacing intervals along the second virtual line, the magneto-electric conversion elements are approximately linearly positioned along the first virtual line. In this case, if the sensitivity axis of the magneto-electric conversion element positioned at an end of each of the first and second magneto-electric conversion element groups is oriented so as to be parallel to the second virtual line and the sensitivity axis of each magneto-electric conversion element positioned at other than the ends of the first and second magneto-electric conversion element groups is oriented so as to be parallel to the first virtual line, even if an adjacent current path moves, measurement precision is not easily lowered. Therefore, even when a cut through which a to-be-measured current path can pass is formed in the printed circuit board, a plurality of magneto-electric conversion elements can be positioned in a narrow width and current can be precisely measured.

In this structure, if the sensitivity axes of the magneto-electric conversion elements at symmetric positions with respect to the positioning position of the to-be-measured current path are oriented in the same direction, the sensitivity affecting axis of the magneto-electric conversion elements at the point-symmetric positions are also positioned so as to be oriented in the same direction, and if the sensitivity axes of the magneto-electric conversion elements at the point-symmetric positions are oriented in opposite directions, the sensitivity affecting axis of the sensitivity axes of magneto-electric conversion elements at the point-symmetric positions are also positioned so as to be oriented in opposite directions. Therefore, by adding a detected value from each magneto-electric conversion element, adverse effects due to magnetic fields in the directions of the sensitivity affecting axes can be offset, so it is possible to prevent a measurement precision drop attributable to the sensitivity affecting axis. To add a detected value from each magneto-electric conversion element, each measured value may be added with a computing device. When magneto-electric conversion elements are connected in series, it is also possible to measure added values.

The sensitivity axis and sensitivity affecting axis of the current sensor according to the present invention may be parallel to the printed circuit board.

This placement simplifies the structure of the current sensor, enabling the current sensor to be easily designed and manufactured and thereby reducing its cost.

The current sensor in the present invention may also be characterized in that a spacing between the magneto-electric conversion element positioned at the furthest end of the first magneto-electric conversion element group and the magneto-electric conversion element positioned at the furthest end of the second magneto-electric conversion element group is the inter-group spacing and that a spacing between the magneto-electric conversion element, in the first magneto-electric conversion element group, positioned at a position closest to the second virtual line and the magneto-electric conversion element, in the second magneto-electric conversion element group, positioned at a position closest to the second virtual line is the widest.

According to this structure, the spacing between the furthest end of the first magneto-electric conversion element group and the furthest end second magneto-electric conversion element group is the inter-group spacing, and the spacing between the magneto-electric conversion elements, in the first magneto-electric conversion element group and second magneto-electric conversion element group, at the positions closest to the second virtual line is widest. Therefore, the distance between each magneto-electric conversion element and the center of the positioning position of the to-be-measured current path can be made the same or can be made the same as much as possible. Accordingly, even if there are variations in angle at which the current sensor is attached to the to-be-measured current path, each magneto-electric conversion element is placed between the to-be-measured current path and another current path adjacent to it with good balance. Therefore, it is possible to achieve a greater reduction in adverse effects by external magnetic fields from other current paths positioned at positions adjacent to the to-be-measured current path and thereby achieve a greater reduction in adverse effects on the magneto-electric conversion elements by the external magnetic fields.

The current sensor in the present invention may also be characterized in that the magneto-electric conversion elements are placed on a virtual ellipse centered on the positioning position of the to-be-measured current path and that the semi-major axis of the virtual ellipse is located on the cut.

According to this structure, since the semi-major axis of the virtual ellipse, on which the magneto-electric conversion elements are positioned, is located on the cut, it is possible to insert the to-be-measured current path into the cut along the semi-major axis and position it therein. Therefore, the outer size of the to-be-measured current path and inter-group spacing can be made as close to each other as possible, so the magneto-electric conversion elements can be positioned as close to the to-be-measured current path as possible. Therefore, it is possible to achieve a greater reduction in adverse effects by external magnetic fields from other current paths positioned at positions adjacent to the to-be-measured current path and thereby achieve a greater reduction in adverse effects on the magneto-electric conversion elements by the external magnetic fields. Accordingly, the current sensor can be made more compact and more stable detected values can be obtained from the magneto-electric conversion elements.

The current sensor in the present invention may also be characterized in that the number of magneto-electric conversion elements is 6.

According to this structure, since the number of magneto-electric conversion elements is 6, it is possible to form a current sensor with a minimum number of magneto-electric conversion elements with which sufficient precision is obtained. Thus, the cost of the current sensor can be reduced and a space in which the magneto-electric conversion elements are positioned can be reduced, so the current sensor can be made more compact.

The current sensor in the present invention may also be characterized in that the number of magneto-electric conversion elements is 8.

According to this structure, since the number of magneto-electric conversion elements is 8, the inter-element spacing of the magneto-electric conversion elements can be made smaller than in a case in which the number of magneto-electric conversion elements is 6. Therefore, it is possible to improve the measurement precision of the current sensor and achieve a greater reduction in adverse effects by external magnetic fields from other current paths positioned at positions adjacent to the to-be-measured current path. Accordingly, adverse effects on the magneto-electric conversion elements by external magnetic fields can be reduced and more stable detected values can be thereby obtained from the magneto-electric conversion elements.

The current sensor in the present invention may also be characterized in that neighboring current paths are positioned at positions adjacent to the to-be-measured current path and that the center of the positioning position of the to-be-measured current path and the centers of the neighboring positioning positions at which the neighboring current paths are positioned are located along the second vertical line.

According to this structure, since the to-be-measured current path and the neighboring current paths positioned at positions adjacent to the to-be-measured current path are positioned along the second vertical line, each neighboring current path is positioned outside the first magneto-electric conversion element group or second magneto-electric conversion element group, so the neighboring current path is positioned outside the inter-element spacing, which is smaller than the inter-group spacing. Therefore, it is possible to achieve an even greater reduction in adverse effects by external magnetic fields from the neighboring current paths and thereby achieve an even greater reduction in adverse effects on the magneto-electric conversion elements by the external magnetic fields. Accordingly, even more stable detected values can be obtained from the magneto-electric conversion elements.

BRIEF DESCRIPTION OF THE DRAWINGS

FIG. 5 is a graph indicating calculation results about the current sensor according to the first embodiment;

FIG. 17 is a perspective view that schematically illustrates the structure of a conventional current sensor.

DESCRIPTION OF THE PREFERRED EMBODIMENTS

Figure 1:
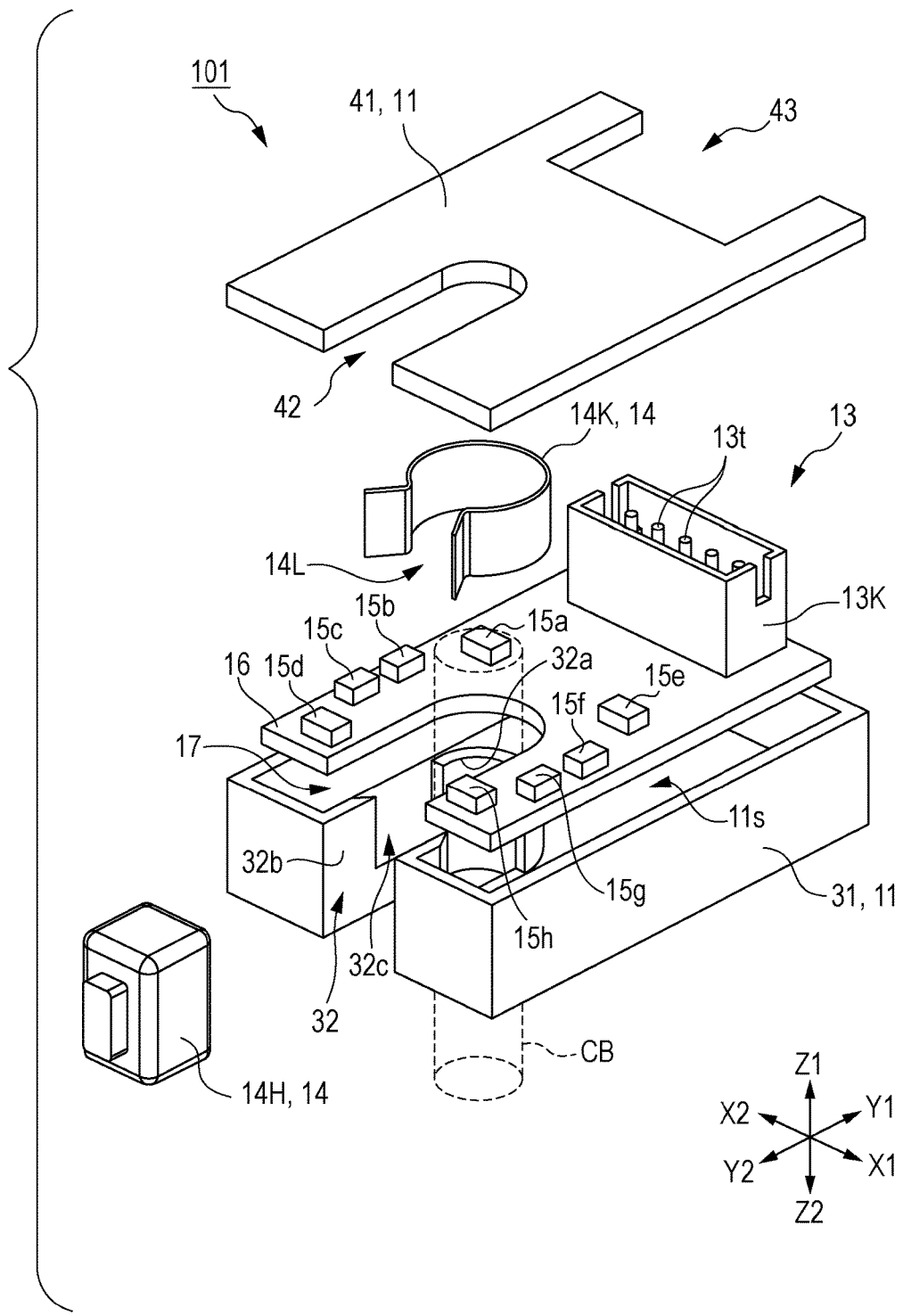
FIG. 1 is an exploded perspective view illustrating a current sensor according to a first embodiment of the present invention.

When a plurality of magneto-electric conversion elements are circumferentially placed around a to-be-measured current path (electric wire) so as to be equally spaced, the to-be-measured current path is inserted from a spacing between magneto-electric conversion elements and is positioned at the central position of the circumference. Therefore, an inter-element spacing between each two magneto-electric conversion elements is determined according to the size (dimension of the maximum width) of the to-be-measured current path. If the dimension of the inter-element spacing is such that at least the to-be-measured current path can pass through the inter-element spacing, the entire area in which the magneto-electric conversion elements are positioned becomes large. As a result, the size of a circuit board on which the magneto-electric conversion elements are positioned also becomes large, preventing the current sensor from being made compact. Another problem is that since the inter-element spacing is widened for all magneto-electric conversion elements to suit the size of the to-be-measured current path, adverse effects by external magnetic fields caused by neighboring current paths adjacent to the to-be-measured current path may arise and precision of detection from the magneto-electric conversion elements may drop.

Noting these points, the inventor thought that when magneto-electric conversion elements are placed so that some inter-element spacings differ, instead of placing all magneto-electric conversion elements around a to-be-measured current path at equal inter-element spacing intervals, the current sensor can be made compact and the detection precision of the current sensor can be stabilized. Specifically, the essentiality of the present invention is that: a first magneto-electric conversion element group including a plurality of magneto-electric conversion elements and a second magneto-electric conversion element group including a plurality of magneto-electric conversion elements, the number of magneto-electric conversion elements in the first magneto-electric conversion element group and the number of magneto-electric conversion elements in the second magneto-electric conversion element group being equal, are placed so that a first virtual line intervenes between them, the first virtual line passing above a cut, which is an introducing path for a to-be-measured current path; the magneto-electric conversion elements in the first magneto-electric conversion element group and second magneto-electric conversion elements group are symmetrically placed with respect to a second virtual line that is orthogonal to the first virtual line at a positioning position at which the to-be-measured current path is positioned so that an inter-element spacing between each two adjacent magneto-electric conversion elements in the first and second magneto-electric conversion element groups becomes smaller than an inter-group spacing between the first and second magneto-electric conversion element groups; and the sensitivity axes of each pair of magneto-electric conversion elements at point-symmetric positions with respect to the positioning position of the to-be-measured current path are orientated in parallel.

In a current sensor having highly sensitive magneto-electric conversion elements, if a magneto-electric conversion element is positioned so that its sensitive axis has a predetermined angle with respect to the direction of an induced magnetic field from a current under measurement, not only an output signal based on an induced magnetic field applied from the direction of the sensitive axis but also an induced magnetic field applied from the direction of the sensitivity affecting axis of the magneto-electric conversion element may affect measurement precision.

In the current sensor in this embodiment, if the sensitivity axes of each pair of magneto-electric conversion elements at point-symmetric positions with respect to the positioning position of the to-be-measured current path are orientated in the same direction, the sensitivity affecting axis of these magneto-electric conversion elements are also oriented in the same direction; if the sensitivity axes of each pair of magneto-electric conversion elements at point-symmetric positions with respect to the positioning position of the to-be-measured current path are orientated in opposite directions, the sensitivity affecting axis of these magneto-electric conversion elements are also oriented in opposite directions. Therefore, detected values obtained from the magneto-electric conversion elements at the point-symmetric positions are processed so that components due to induced magnetic fields applied in the directions of the sensitivity affecting axes are offset, it is possible to suppress adverse effects on measurement precision by magnetic fields in the directions of the sensitivity affecting axes. For example, in a current sensor that uses magneto-resistive elements as magneto-electric conversion elements, to linearly change a resistance depending on the strength of the magnetic field, a certain magnetic force called a hard bias is added in a direction orthogonal to the sensitivity axis. Therefore, if a magnetic field is applied in a direction orthogonal to the sensitivity axis, the sensitivity of the magneto-resistive element is changed. Even in this case, the current sensor in this embodiment can prevent a measurement precision drop attributable to the sensitivity affecting axis.

In this embodiment, the sensitivity affecting axis is, for example, an axis in a direction that is substantially orthogonal to the sensitive axis in a magneto-electric conversion element; the sensitivity affecting axis is an axis in a direction in which a resistance is changed due to an adverse effect by a magnetic field (the detection sensitivity of the sensitivity axis is changed) (the axis is also referred to as a sensitivity changing axis or sub-sensitivity axis).

Embodiments of the present invention will be described below with reference to the drawings.

First embodiment

Figure 2:
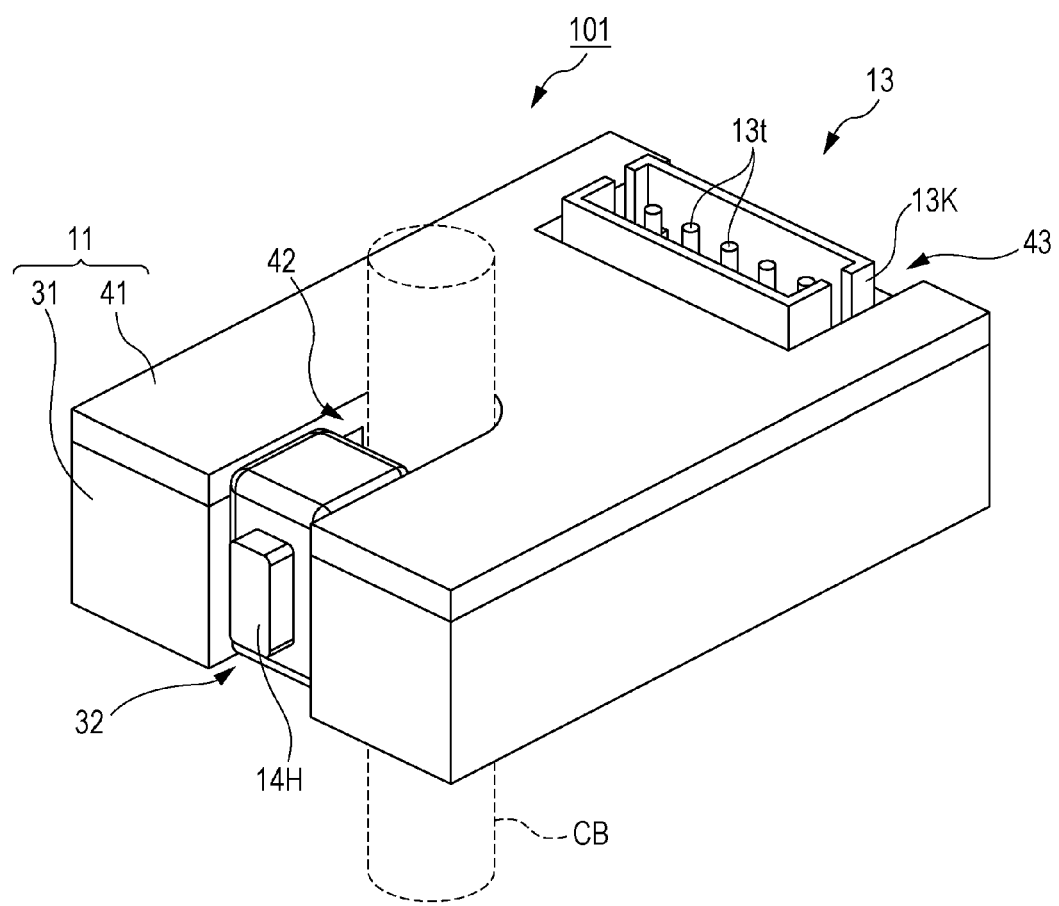
FIG. 2 is a perspective view illustrating the current sensor according to the first embodiment.
Figure 3:
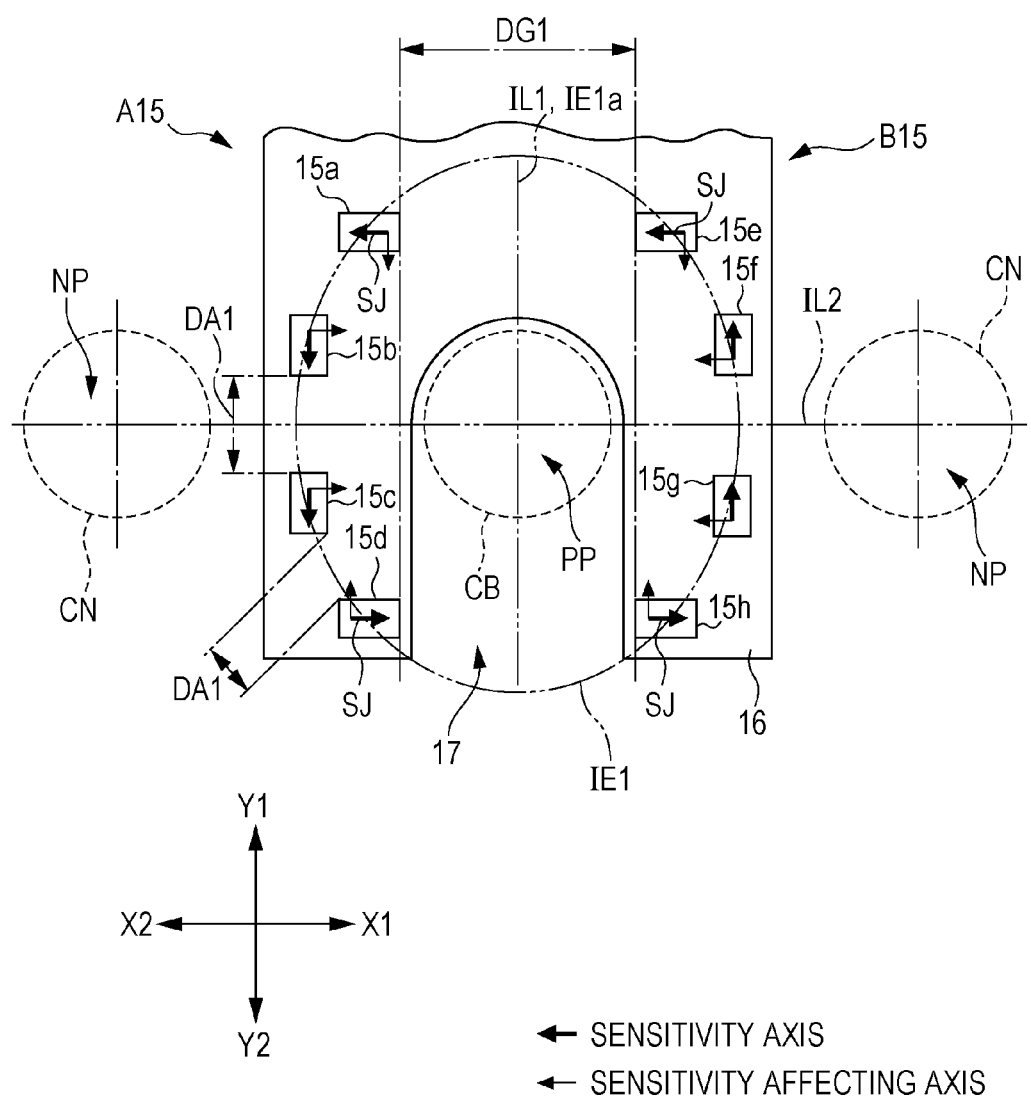
FIG. 3 is a drawing illustrating the current sensor according to the first embodiment, indicating a top view of a printed circuit board when viewed from the same side as Z1 in FIG. 1.
Figure 14:
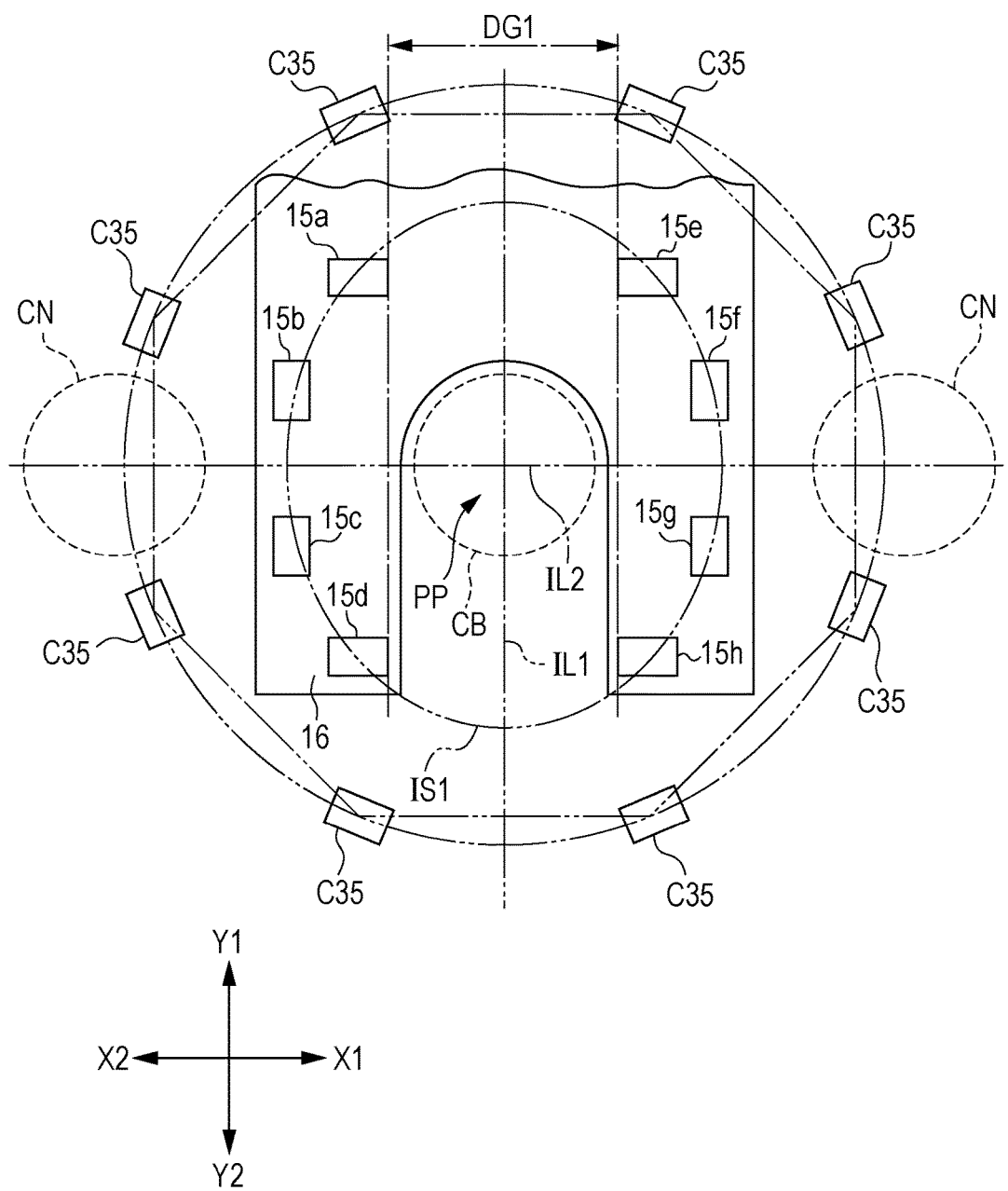
FIG. 14 is a drawing illustrating a comparative example compared with the current sensor according to the first embodiment of the present invention, illustrating a placement of magneto-electric conversion elements according to a third comparative example, which is compared with the placement of the magneto-electric conversion elements in FIG. 3.

FIG. 1 is an exploded perspective view illustrating a current sensor 101 according to a first embodiment of the present invention. FIG. 2 is a perspective view illustrating the current sensor 101 according to the first embodiment of the present invention. FIG. 3 is a drawing illustrating the current sensor 101 according to the first embodiment of the present invention, indicating a top view of a printed circuit board 16 when viewed from the same side as Z1 in FIG. 1. FIG. 14 is a drawing illustrating a comparative example compared with the current sensor 101 according to the first embodiment of the present invention, illustrating a placement of magneto-electric conversion elements according to a third comparative example, which is compared with the placement of the magneto-electric conversion elements 15 in FIG. 3.

As illustrated in FIGS. 1 and 2, the current sensor 101 according to the first embodiment of the present invention includes a printed circuit board 16 and a plurality of magneto-electric conversion elements 15 that detect a magnetism generated when a current flows in a to-be-measured current path CB, the magneto-electric conversion elements 15 being positioned on the printed circuit board 16. The current sensor 101 also includes a case 11 having an accommodating part 11s in which the printed circuit board 16 is accommodated, a connector 13 having terminals 13t from which electric signals are retrieved from the magneto-electric conversion elements 15, and a retaining member 14 that secures the to-be-measured current path CB and retains it.

The case 11 is made of, for example, acrylonitrile butadiene styrene (ABS), polyethylene terephthalate (PET), or another synthetic resin material. The case 11 is structured with a case 31 formed in a box-like shape having an opening at the upper part and a cover 41 formed in a plate-like shape, which covers the opening of the case 31. An accommodating part 11s, in which the printed circuit board 16 is accommodated, is formed in the case 31. Although a synthetic resin material is used as the material of the case 11, this is not a limitation; for example, a metal material may be used.

A concave part (concave groove) 32 is formed in the case 31 so as to extend from its one side toward the center of the case 31. The to-be-measured current path CB is inserted into the concave part 32 and is secured therein. The back wall 32a of the concave part 32 is formed in a complementary shape with the outer circumferential surface of the to-be-measured current path CB. In this embodiment, the back wall 32a of the concave part 32 is curved in an arc shape so as to match the outer circumferential surface of the to-be-measured current path CB. The inner walls 32b of the case 31 are linked to the back wall 32a and face each other. Recesses 32c, into which the free ends of a clip spring 14K snap, are formed in the inner walls 32b at positions at which the recesses 32c face each other. Each recess 32c has a cut extending from the upper end of the inner wall 32b toward the bottom. The end face of the recess 32c on the inlet side is formed so as to incline toward the outside. The back side of the outer circumferential surface of the to-be-measured current path CB is brought into contact with the back wall 32a of the concave part 32. In this state, the front side of the outer circumferential surface of the to-be-measured current path CB is held by the clip spring 14K, which extends from the recesses 32c toward the interior of the concave part 32, retaining the to-be-measured current path CB in the case 11. The position at which the to-be-measured current path CB is held by the clip spring 14K and the back wall 32a of the concave part 32 is a positioning position PP at which the to-be-measured current path CB is positioned in the case 11.

The cover 41 has an opening 42 in one edge. The opening 42 has the same shape as the concave part 32 of the case 31 so that the opening 42 matches the concave part 32. In an edge opposite to the edge in which the opening 42 is formed, an opening 43 is formed so that the upper portion of the connector 13 is exposed to the outside of the case 11.

A holding member 14 secures and holds the to-be-measured current path CB. The holding member 14 has the clip spring 14K, which catches the outer surface of the to-be-measured current path CB and holds it, and also has a pressing member 14H, which presses the clip spring 14K after the to-be-measured current path CB has been positioned at the positioning position PP.

The clip spring 14K is formed by curving a strip-like leaf spring in a substantially arc shape in a plan view and bending two free ends in a direction away from each other (toward the outside) so that a spacing 14L is formed on the free end side. The clip spring 14K is accommodated in the accommodating part 11s of the case 31 and is positioned so that, in a state in which the concave part 32 of the curved portion matches the back wall 32a, the free ends are brought into contact with the inclined surfaces of the recesses 32c and the bent portion of each free end protrudes from the recess 32c toward the interior of the concave part 32. The spacing 14L between the bent portions of the free ends of the clip spring 14K is formed so that the spacing 14L is enough for the to-be-measured current path CB to be inserted up to the positioning position PP but is smaller than the maximum diameter (maximum width) of the to-be-measured current path CB inserted into the concave part 32 to prevent the to-be-measured current path CB from easily coming off the positioning position PP.

The pressing member 14H is formed in a substantially rectangular parallelepiped shape. Its size is such that the pressing member 14H firmly fits to the concave part 32 formed in the case 31. The pressing member 14H presses the clip spring 14K, in which state the pressing member 14H is held in the concave part 32 of the case 31. In the current sensor 101 formed as described above, when the to-be-measured current path CB is inserted into the concave part 32 of the case 31 and is pressed against the bent portions of the clip spring 14K, the bent portions being exposed to the interior of the concave part 32, the clip spring 14K allows a warp and, while each free end is guided along the inclined surface of the recess 32c, the bent portion protrudes toward the interior of the accommodating part 11s, expanding the spacing 14L between the bent portions. When the to-be-measured current path CB is further pressed until it comes into contact with the back wall 32a, the free ends are guided along the inclined surfaces of the recesses 32c and the bent portions return to an initial position at which the bent portions are exposed to the interior of the concave part 32. At that time, the outer circumferential surface of the to-be-measured current path CB is held by the back wall 32a and the bent portions of the clip spring 14K. When the pressing member 14H is pressed into the concave part 32, the bent portions of the clip spring 14K are pressed. Since the retaining member 14 formed with the pressing member 14H and clip spring 14K and the back wall 32a of the concave part 32 cooperate, the to-be-measured current path CB can be precisely positioned at the positioning position PP. Although, in this embodiment, the cross-sectional shape of the to-be-measured current path CB is circular, the to-be-measured current path CB may have a rectangular cross-section. In this case, it is preferable for the clip spring 14K of the retaining member 14 to have a shape that matches a to-be-measured current path having a rectangular cross section.

A double-sided printed circuit board (PCB), which is widely known in general, for example, is used as the printed circuit board 16. Metal foils, such as copper (Cu) foils, formed on a base board made of a glass-filled epoxy resin are patterned to form wiring patterns. The printed circuit board 16 is formed in a size suitable for it being accommodated in the accommodating part 11s of the case 31. A cut 17 is formed at one edge of the printed circuit board 16, the to-be-measured current path CB being inserted into the cut 17 and positioned therein. Specifically, the printed circuit board 16 is formed in a shape similar to the shape of the bottom of the accommodating part 11s and has the cut 17, which is formed in a complementary shape with the concave part 32 of the case 31. As illustrated in FIGS. 1 and 3, a plurality (eight) of magneto-electric conversion elements 15 are positioned in the vicinity of the cut 17 in the printed circuit board 16, and the connector 13 is positioned in the vicinity of the edge opposite to the edge at which the cut 17 is formed. Placement in which the magneto-electric conversion elements 15 are positioned will be described later in detail. Although, in this embodiment, a printed circuit board (PCB) made of a glass-filled epoxy resin is used as the printed circuit board 16, this is not a limitation. The printed circuit board 16 has only to be an insulated rigid printed circuit board; for example, a ceramic printed circuit board may be used. Although, in this embodiment, a double-sided printed circuit board (PCB) is used as the printed circuit board 16, a single-sided printed circuit board (PCB) may be used depending on a circuit design result.

The connector 13 has a plurality of terminals that are electrically connected to a mating connector (not illustrated). Some of the plurality of connectors are retrieval terminals 13t that retrieve electric signals from the magneto-electric conversion elements 15. The connector 13 also has an insulated substratum 13K that fits to the mating connector (not illustrated). The insulated substratum 13K is formed in a box-like shape having an opening at the upper part. The plurality of terminals including retrieval terminals 13t are held in the insulated substratum 13K with each two adjacent terminals being insulated from each other. Although, in this embodiment, the connector 13 is used to retrieve electric signals from the magneto-electric conversion elements 15, this is not a limitation; for example, a flexible printed circuit (FPC) board or the like may be used.

The magneto-electric conversion element 15 is a current sensor element that detects a magnetism that is generated when a current flows in the to-be-measured current path CB. A magneto-electric conversion element using a giant magneto-resistive effect element (referred to as a giant magneto-resistive (GMR) element), for example, can be used as the magneto-electric conversion element 15. Although details of the magneto-electric conversion element 15 are not illustrated to simplify its explanation, the magneto-electric conversion element 15 is formed by manufacturing a GMR element on a silicon substrate, packaging a cut-out chip with a thermosetting synthetic resin, and electrically connecting lead terminals, which are used to retrieve signals, to the GMR element. The lead terminals are soldered to the printed circuit board 16.

As illustrated in FIG. 3, the magneto-electric conversion elements 15 are divided into a first magneto-electric conversion element group A15, including half of them (in this embodiment, four magneto-electric conversion elements 15 denoted 15a to 15d), and a second magneto-electric conversion element group B15, including the remaining half (in this embodiment, four magneto-electric conversion elements 15 denoted 15e to 15h). The first magneto-electric conversion element group A15 and second magneto-electric conversion element group B15 are positioned so as to interpose the cut 17 therebetween. That is, the magneto-electric conversion elements 15 constitute the first magneto-electric conversion element group A15 and second magneto-electric conversion element group B15, each of which includes the same number of magneto-electric conversion elements 15 (magneto-electric conversion elements 15a to 15d or magneto-electric conversion elements 15e to 15h), and the first magneto-electric conversion element group A15 and second magneto-electric conversion element group B15 are oppositely placed so as to interpose the cut 17 therebetween.

The first magneto-electric conversion element group A15 and second magneto-electric conversion element group B15 are symmetrically positioned with respect to a first virtual line IL1. The four magneto-electric conversion elements 15 in the first magneto-electric conversion element group A15 are symmetrically positioned with respect to a second virtual line IL2, and the four magneto-electric conversion elements 15 in the second magneto-electric conversion element group B15 are also symmetrically positioned with respect to the second virtual line IL2. When the to-be-measured current path CB is placed in the cut 17 in the printed circuit board 16, the first virtual line IL1 and second virtual line IL2 are orthogonal to each other at the positioning position PP at which the to-be-measured current path CB is positioned. That is, the first magneto-electric conversion element group A15 and second magneto-electric conversion element group B15 are positioned so as to interpose the first virtual line IL1 therebetween, the first virtual line IL1 passing through the positioning position PP of the to-be-measured current path CB and extending in a direction in which the cut 17 is formed, and so as to be placed along the first virtual line IL1. The magneto-electric conversion elements 15a to 15d constituting the first magneto-electric conversion element group A15 and the magneto-electric conversion elements 15e to 15h constituting the second magneto-electric conversion element group B15 are symmetrically positioned with respect to the second virtual line IL2 that is orthogonal to the first virtual line IL1 at the positioning position PP of the to-be-measured current path CB. Thus, a space in which the magneto-electric conversion elements 15 are positioned can be reduced in the direction of the second virtual line, in spite of the placement of the magneto-electric conversion elements 15 with the to-be-measured current path CB inserted and positioned, when compared with a case (third comparative example) in which magneto-electric conversion elements C35 are positioned on a circumference so as to be equally spaced as illustrated in FIG. 14. Specifically, in the third comparative example in which the magneto-electric conversion elements C35 are used, they are placed on a circumference centered on the position at which the to-be-measured current path CB is positioned, so as to be equally spaced. Therefore, when the to-be-measured current path CB is inserted from between magneto-electric conversion elements C35 and is positioned at the positioning position, an inter-element spacing between each two magneto-electric conversion elements C35 needs to be large enough for at least the to-be-measured current path CB to pass through, requiring a large area in order to position all magneto-electric conversion elements C35. This needs the printed circuit board to be enlarged. By contrast, in the placement of the magneto-electric conversion elements 15 according to this embodiment, the first magneto-electric conversion element group A15 and second magneto-electric conversion element group B15 are positioned so as to interpose the first virtual line IL1 therebetween, the first virtual line IL1 passing through the positioning position PP of the to-be-measured current path CB and extending in a direction in which the cut 17 is formed, and so as to be positioned along the first virtual line IL1. That is, if an inter-group spacing DG1 between the first magneto-electric conversion element group A15 and the second magneto-electric conversion element group B15 is large enough for the portion of the to-be-measured current path CB with the maximum diameter to pass through, an inter-element spacing DA1 can be made smaller (narrower) than the inter-group spacing DG1, the inter-element spacing DA1 being between each adjacent two of the magneto-electric conversion elements 15a to 15d constituting the first magneto-electric conversion element group A15 and between each adjacent two of the magneto-electric conversion elements 15e to 15h constituting the second magneto-electric conversion element group B15. Therefore, the area in which the magneto-electric conversion elements 15 are positioned can be made smaller than the area in which the magneto-electric conversion elements C35 in the third comparative example are positioned, particularly in a direction orthogonal to the direction in which the cut 17 is formed (in a direction in which the second virtual line IL2 extends), so the printed circuit board 16 can be made compact, that is, the current sensor 101 can be made compact. Although, in this embodiment, the first virtual line IL1 and second virtual line IL2 are orthogonal to each other at the center of the to-be-measured current path CB, this is not a limitation; they need only to be orthogonal to each other at least at the positioning position PP of the to-be-measured current path CB.

As illustrated in FIG. 3, the spacing between the magneto-electric conversion element 15 at the farthest end in the first magneto-electric conversion element group A15 and the magneto-electric conversion element 15 at the farthest end in the second magneto-electric conversion element group B15 is preferably the inter-group spacing DG1, which is the narrowest spacing between the first magneto-electric conversion element group A15 and the second magneto-electric conversion element group B15, and the spacing between the magneto-electric conversion element 15 positioned at the position closest to the second virtual line IL2 in the first magneto-electric conversion element group A15 and the magneto-electric conversion element 15 positioned at the position closest to the second virtual line IL2 in the second magneto-electric conversion element group B15 is preferably widest. The inter-element spacing DA1, which is the spacing between each two adjacent magneto-electric conversion elements 15 in the first magneto-electric conversion element group A15 and in the second magneto-electric conversion element group B15 is narrower than the inter-group spacing DG1, which is the narrowest spacing between the first magneto-electric conversion element group A15 and the second magneto-electric conversion element group B15. That is, the inter-element spacing DA1 between each adjacent two of the magneto-electric conversion elements 15 constituting the first magneto-electric conversion element group A15 in the direction in which the first virtual line IL1 extends and between each adjacent two of the magneto-electric conversion elements 15 constituting the second magneto-electric conversion element group B15 in the direction in which the first virtual line IL1 extends is made smaller than the inter-group spacing DG1 between the first magneto-electric conversion element group A15 and the second magneto-electric conversion element group B15, which interpose the first virtual line IL1 therebetween, the first virtual line IL1 passing through the cut 17; the magneto-electric conversion elements 15 are placed so that some inter-element spacings DA1 are made to differ, instead of making all inter-element spacings DA1 of the magneto-electric conversion elements 15 the same. Thus, the inter-element spacing DA1 between each two adjacent magneto-electric conversion elements 15 can be narrowed in the same magneto-electric conversion element group, in spite of the placement of the magneto-electric conversion elements 15 with the to-be-measured current path CB inserted and positioned, when compared with a case (third comparative example) in which magneto-electric conversion elements C35 are positioned on a circumference so as to be equally spaced as illustrated in FIG. 14. Therefore, adverse effects by external magnetic fields from the neighboring current paths CN at positions adjacent to the to-be-measured current path CB can be reduced. Since the adverse effects on the magneto-electric conversion elements 15 by the external magnetic fields are reduced, stable detected values can be obtained from the magneto-electric conversion elements 15.

Furthermore, as illustrated in FIG. 3, the magneto-electric conversion elements 15 are preferably positioned on a virtual ellipse IE1 centered on the positioning position PP of the to-be-measured current path CB and the semi-major axis IE1a of the virtual ellipse IE1 is preferably located on the cut 17. The major axis of the virtual ellipse IE1 overlaps the first virtual line ILL and the above-mentioned semi-major axis IE1a is the semi-major axis of the lower portion of the virtual ellipse IE1 in FIG. 3. Thus, the to-be-measured current path CB can be inserted into the cut 17 along the semi-major axis IE1a and is positioned therein, so the external dimension of the to-be-measured current path CB and the inter-group spacing DG1 can be made as close to each other as possible. This makes it possible for the magneto-electric conversion elements 15 to be positioned as close to the to-be-measured current path CB as possible, so adverse effects by external magnetic fields from the neighboring current paths CN at positions adjacent to the to-be-measured current path CB can be further reduced. As a result, since adverse effects on the magneto-electric conversion elements 15 by the external magnetic fields are further reduced, more stable detected values can be obtained from the magneto-electric conversion elements 15.

Figure 8:
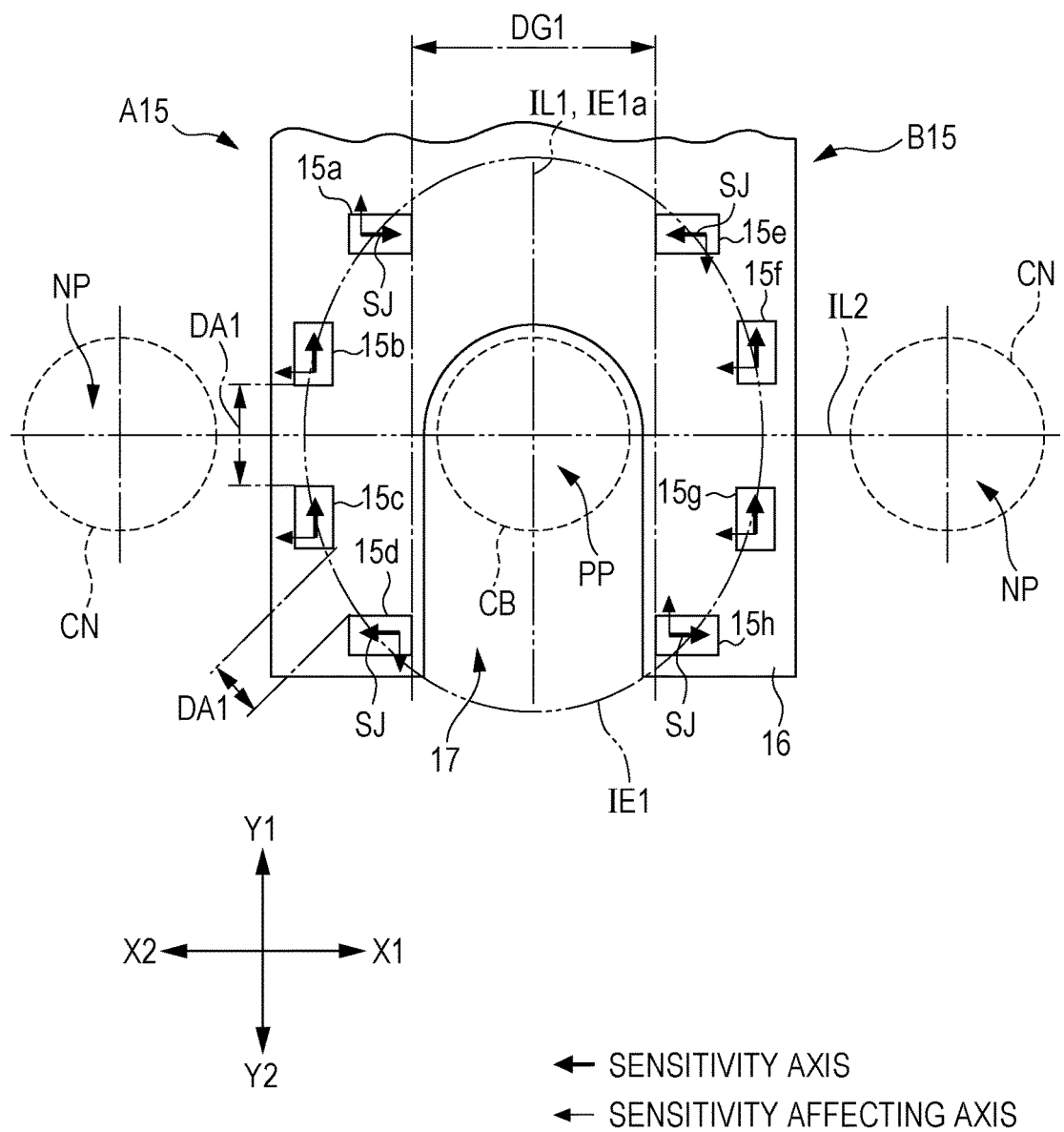
FIG. 8 is a drawing illustrating a current sensor according to a modification of the first embodiment, indicating a top view of the printed circuit board when viewed from the same side as Z1 in FIG. 1.

When the to-be-measured current path CB is placed in the cut 17 formed in the printed circuit board 16, the magneto-electric conversion elements 15 are positioned so that the orientations SJ of the sensitivity axes (directions in which a magnetism is detected) of the GMR elements in each of a plurality of pairs of magneto-electric conversion elements 15 that are symmetrical with respect to the positioning position PP of the to-be-measured current path CB become parallel. That is, the magneto-electric conversion elements 15 are positioned so that the directions of the sensitivity axes of each pair of magneto-electric conversion elements 15 at positions that are symmetrical with respect to the positioning position PP of the to-be-measured current path CB (for example, magneto-electric conversion element 15a and magneto-electric conversion element 15h) become parallel. Although, in this embodiment, the orientations SJ of the sensitivity axes of each pair of magneto-electric conversion elements 15 at positions that are symmetrical with respect to the positioning position PP of the to-be-measured current path CB (for example, magneto-electric conversion element 15a and magneto-electric conversion element 15h) are in opposite directions (that is, the directions of the sensitive axes are parallel and the orientations of the sensitive axes are in opposite directions), if the directions of the sensitive axes are parallel, the orientations of the sensitive axes may be in the same direction as illustrated in FIG. 8. FIG. 8 is a drawing illustrating a current sensor according to a modification of the first embodiment, indicating a top view of a printed circuit board when viewed from the same side as Z1 in FIG. 1. As illustrated in FIG. 8, the directions of the sensitivity axes of each pair of magneto-electric conversion elements 15 at positions that are symmetrical with respect to the positioning position PP of the to-be-measured current path CB (for example, magneto-electric conversion element 15a and magneto-electric conversion element 15h) are parallel and the orientations SJ of the sensitivity axes are in the same directions. If the directions of the sensitivity axes are parallel and the orientations of the sensitivity axes are in the same directions, a sign needs to be inverted in calculation processing performed in a subsequent calculation circuit.

As illustrated in FIG. 3, the direction of the sensitivity axis of each magneto-electric conversion element 15 (in FIG. 3, orientation SJ of the sensitivity axis) is parallel to the first virtual line IL1 or second virtual line IL2. Accordingly, each magneto-electric conversion element 15 can be easily mounted on the printed circuit board 16 and positional relationships between the magneto-electric conversion elements 15 and the printed circuit board 16 can be easily designed when compared with a case (third comparative example) in which magneto-electric conversion elements C35 are positioned on a circumference so as to be equally spaced as illustrated in FIG. 14. Therefore, precision for, for example, the installation angle and installation position of the to-be-measured current path CB can be increased, so measurement precision can be improved.

As illustrated in FIG. 3, each magneto-electric conversion element 15 (one of magneto-electric conversion elements 15a to 15h) is preferably mounted on the printed circuit board 16 so that its sensitivity axis and sensitivity affecting axis become parallel to the surface of the printed circuit board 16. An angle formed by the sensitivity axis and sensitivity affecting axis (sensitivity changing axis) of each magneto-electric conversion element 15 (one of magneto-electric conversion elements 15a to 15h) is the same. In the example illustrated in FIG. 3, the sensitivity affecting axes of all magneto-electric conversion elements 15 (15a to 15h) are angled about 90 degrees in the counterclockwise direction with respect to the sensitivity axis.

In the example illustrated in FIG. 3, the orientations of the sensitivity axes of each pair of magneto-electric conversion elements 15 (a pair among magneto-electric conversion elements 15a to 15h) at positions that are symmetrical with respect to the positioning position PP are in opposite directions and the orientations of their sensitivity affecting axes are also in opposite directions.

When the magneto-electric conversion elements 15a to 15h are placed so that their sensitivity affecting axes are oriented as illustrated in FIG. 3 and values detected by each pair of magneto-electric conversion elements 15 at point-symmetrical positions are processed so that components due to induced magnetic fields applied from the directions of the sensitivity affecting axes are offset, adverse effects on measurement precision by the magnetic fields in the directions of the sensitivity affecting axes can be suppressed. This can prevent a measurement precision drop attributable to the sensitivity affecting axis.

In the example in FIG. 3, if the orientations of the sensitivity affecting axes of each pair of magneto-electric conversion elements 15 (a pair among magneto-electric conversion elements 15a to 15h) at positions that are symmetrical with respect to the positioning position PP are in opposite directions, the orientations of the sensitivity affecting axes of the magneto-electric conversion elements 15a to 15h are not limited to the orientations illustrated in FIG. 3.

In the example in FIG. 8 as well, each magneto-electric conversion element 15 (one of magneto-electric conversion elements 15a to 15h) is preferably mounted on the printed circuit board 16 so that its sensitivity axis and sensitivity affecting axis become parallel to the surface of the printed circuit board 16.

In the example illustrated in FIG. 8, the orientations of the sensitivity axes of each pair of magneto-electric conversion elements 15 (a pair among magneto-electric conversion elements 15a to 15h) at positions that are symmetrical with respect to the positioning position PP are in the same direction and the orientations of their sensitivity affecting axes are also in the same direction.

In the example in FIG. 8, if the orientations of the sensitivity affecting axes of each pair of magneto-electric conversion elements 15 (a pair among magneto-electric conversion elements 15a to 15h) at positions that are symmetrical with respect to the positioning position PP are parallel, the orientations of the sensitivity affecting axes of the magneto-electric conversion elements 15a to 15h are not limited to the orientations illustrated in FIG. 8.

In the example in FIG. 8 as well, when the sensitivity affecting axes of the magneto-electric conversion elements 15a to 15h are oriented in the directions as described above, adverse effects on measurement precision by the magnetic fields in the directions of the sensitivity affecting axes can be suppressed.

Figure 4:
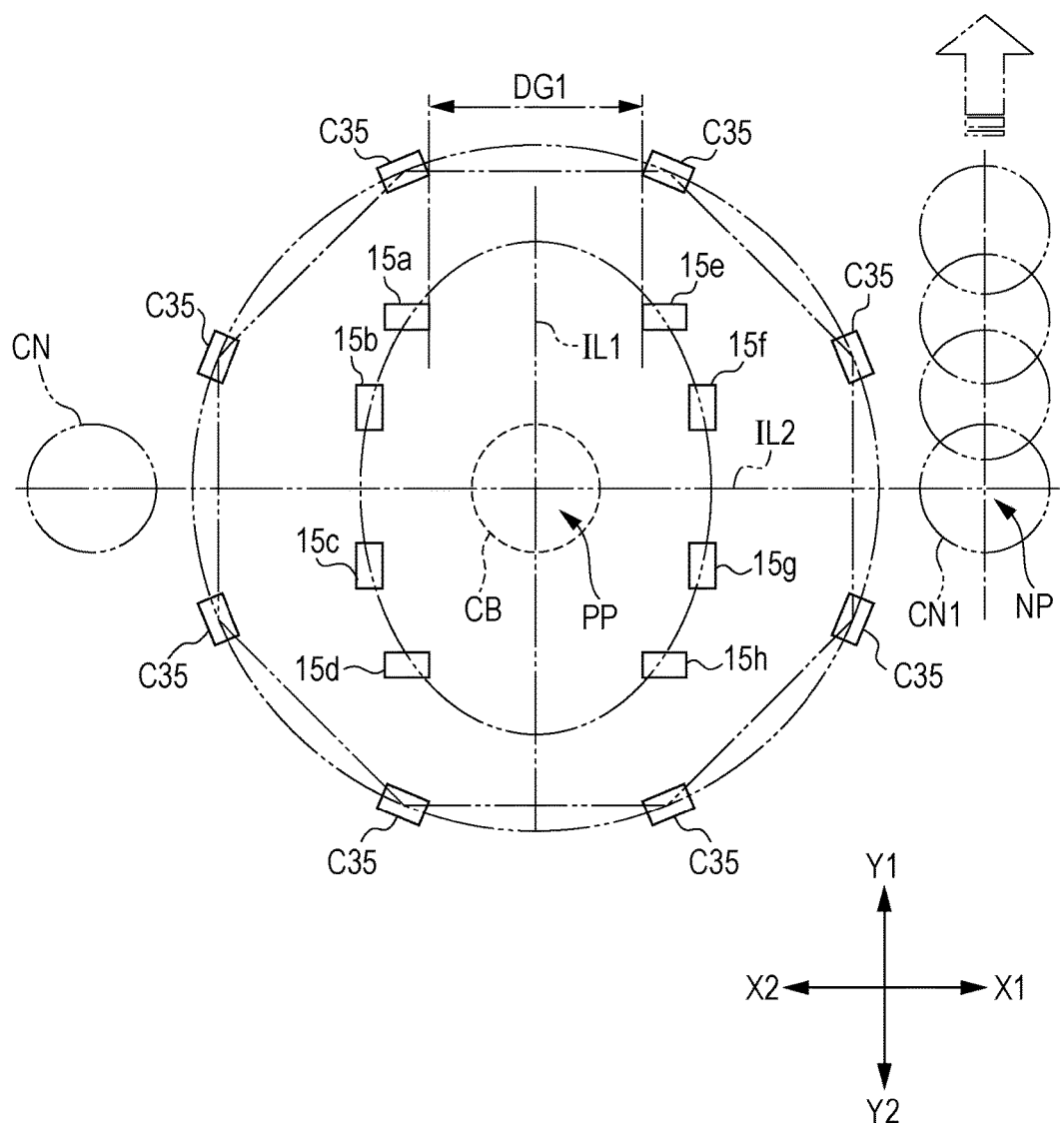
FIG. 4 is a drawing referenced to explain calculation results about the current sensor according to the first embodiment, illustrating a model used in the calculations.

Next, calculations were performed by using the Biot-Savart law for the current sensor 101 according to the first embodiment of the present invention, and effects were verified. FIG. 4 is a drawing referenced to explain calculation results about the current sensor 101 according to the first embodiment of the present invention, illustrating a model used in the calculations. FIG. 4 illustrates the elliptical placement of the magneto-electric conversion elements 15 in the current sensor 101 according to the first embodiment of the present invention and the regular octagonal placement of the magneto-electric conversion elements C35 in the third comparative example by overlapping these placements. In FIG. 4, a neighboring current path CN1 slightly shifts in the Y1 direction. FIG. 5 is a graph indicating calculation results about the current sensor 101 according to the first embodiment of the present invention. The horizontal axis indicates the amount of motion of the neighboring current path CN1 in the Y1 direction. The vertical axis indicates error from the true values of output values obtained from the magneto-electric conversion element 15 of the current sensor 101 and from the magneto-electric conversion elements C35 in the third comparative example.

The values used in the calculations were as follows: the inter-group spacing DG1 of the magneto-electric conversion elements 15 is 7 mm, the maximum distance from the first virtual line IL1 to the magneto-electric conversion elements 15 is 4.5 mm, and the maximum distance from the second virtual line IL2 to the magneto-electric conversion elements 15 is 4.3 mm. The magneto-electric conversion elements C35 in the third comparative example were placed so that the inter-element spacing of the magneto-electric conversion elements C35 matches the inter-group spacing DG1 (7 mm) of the magneto-electric conversion elements 15 and the center of each magneto-electric conversion element C35 is aligned to a vertex of a regular octagon. In a case in which the amount of motion of the neighboring current path CN1 is 0, the center of the positioning position PP of the to-be-measured current path CB and the centers of the neighboring positioning positions NP of the neighboring current paths CN1 positioned at positions adjacent to the to-be-measured current path CB are located along the second virtual line IL2. The distance between the center of the positioning position PP of the to-be-measured current path CB and the center of the neighboring positioning position NP of each neighboring current path CN1 is 10 mm.

As illustrated in FIG. 5, calculation results indicate that error (indicated by A1 in FIG. 5) of the output values from the magneto-electric conversion elements 15 in the current sensor 101 in the present invention is extremely small values when compared with error (indicated by C in FIG. 5) of the output values from the magneto-electric conversion elements C35 in the third comparative example. Stable output values (value with less error) were also obtained even if the position of the neighboring current path CN1 changes. Thus, it can be said that the current sensor 101 in the first embodiment of the present invention can reduce adverse effects by external magnetic fields from other current paths (neighboring current paths CN1) positioned at positions adjacent to the to-be-measured current path CB and can thereby reduce adverse effects on the magneto-electric conversion elements 15 by the external magnetic fields.

Figure 6A:
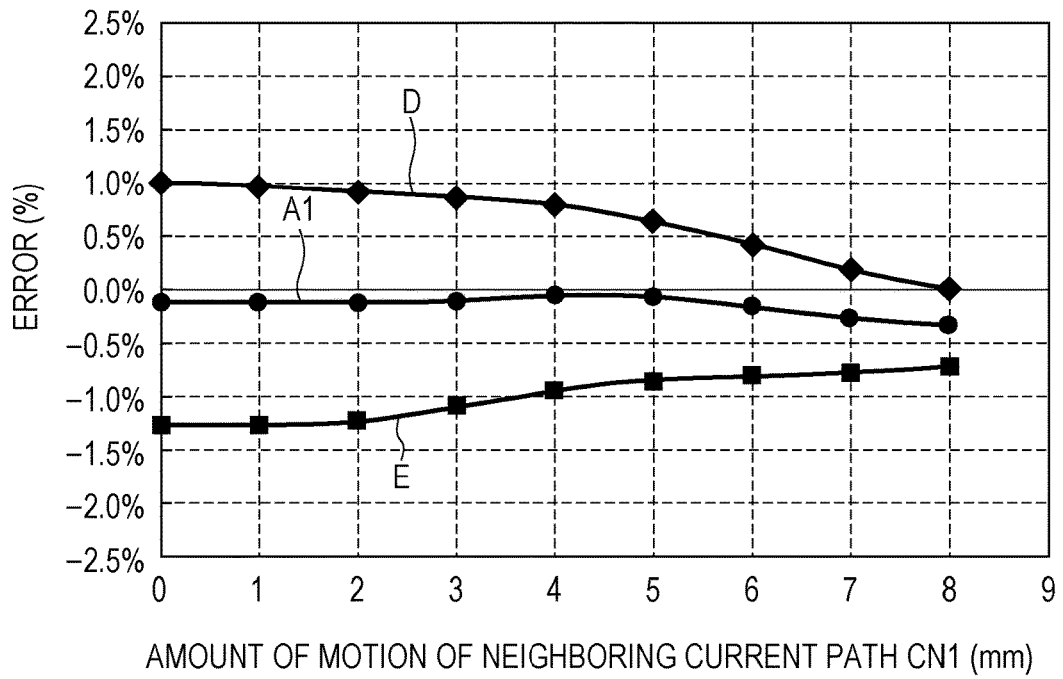
FIG. 6A is a graph indicating calculation results about the current sensor according to the first embodiment in a case in which magneto-electric conversion elements are not symmetrical with respect to a first virtual line.
Figure 6B:
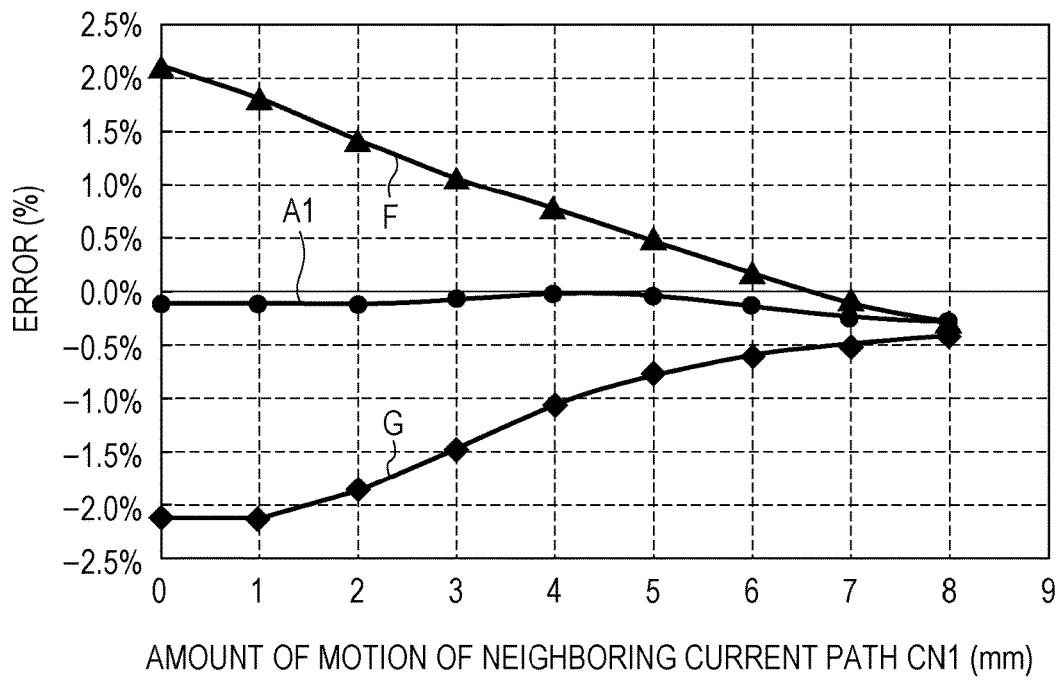
FIG. 6B is a graph indicating calculation results about the current sensor in a case in which the magneto-electric conversion elements are not symmetrical with respect to a second virtual line.

The model in FIG. 4 was modified and verification was also performed for a case in which the elliptical placement of the magneto-electric conversion elements 15 is unbalanced. FIG. 6A is a graph indicating calculation results about the current sensor 101 according to the first embodiment of the present invention in a case in which the magneto-electric conversion elements 15 are not symmetrical with respect to the first virtual line IL1, and FIG. 6B is a graph indicating calculation results about the current sensor 101 in a case in which the magneto-electric conversion elements 15 are not symmetrical with respect to the second virtual line IL2. To use changed values in calculations, the distances of the magneto-electric conversion elements 15 on one side from the first virtual line IL1 were shifted 5.5 mm (indicated by D in FIG. 6A) and 3.5 mm (indicated by E in FIG. 6A) and the distances of the magneto-electric conversion elements 15 on one side from the second virtual line IL2 were shifted 5.3 mm (indicated by F in FIG. 6B) and 3.3 mm (indicated by G in FIG. 6B).

Calculation results indicate that, as indicated in FIG. 6A, error (indicated by D and E in FIG. 6A) in a case in which the magneto-electric conversion elements 15 are not symmetrical with respect to the first virtual line IL1 is significantly smaller than error (indicated by C in FIG. 5) of output values from the magneto-electric conversion elements C35 in the third comparative example, but is larger than error (indicated by A1 in FIG. 6A) of the output values from the magneto-electric conversion elements 15 in the current sensor 101 in the present invention. Similarly, as indicated in FIG. 6B, error (indicated by F and G in FIG. 6B) in a case in which the magneto-electric conversion elements 15 are not symmetrical with respect to the second virtual line IL2 is larger than error (indicated by A1 in FIG. 6B) of the output values from the magneto-electric conversion elements 15 in the current sensor 101 in the present invention. In both cases, as the amount of motion of the neighboring current path CN1 becomes large, the distance of the neighboring current path CN1 increases accordingly, so error in output values becomes small. Thus, it can be said that it is more preferable for the first magneto-electric conversion element group A15 and second magneto-electric conversion element group B 15 to be symmetrically positioned with respect to the first virtual line IL1. Similarly, it can be said that it is more preferable for the magneto-electric conversion elements 15 in the first magneto-electric conversion element group A15 to be symmetrically positioned with respect to the second virtual line IL2 and for the magneto-electric conversion elements 15 in the second magneto-electric conversion element group B15 to be symmetrically positioned with respect to the second virtual line IL2.

Figure 7:
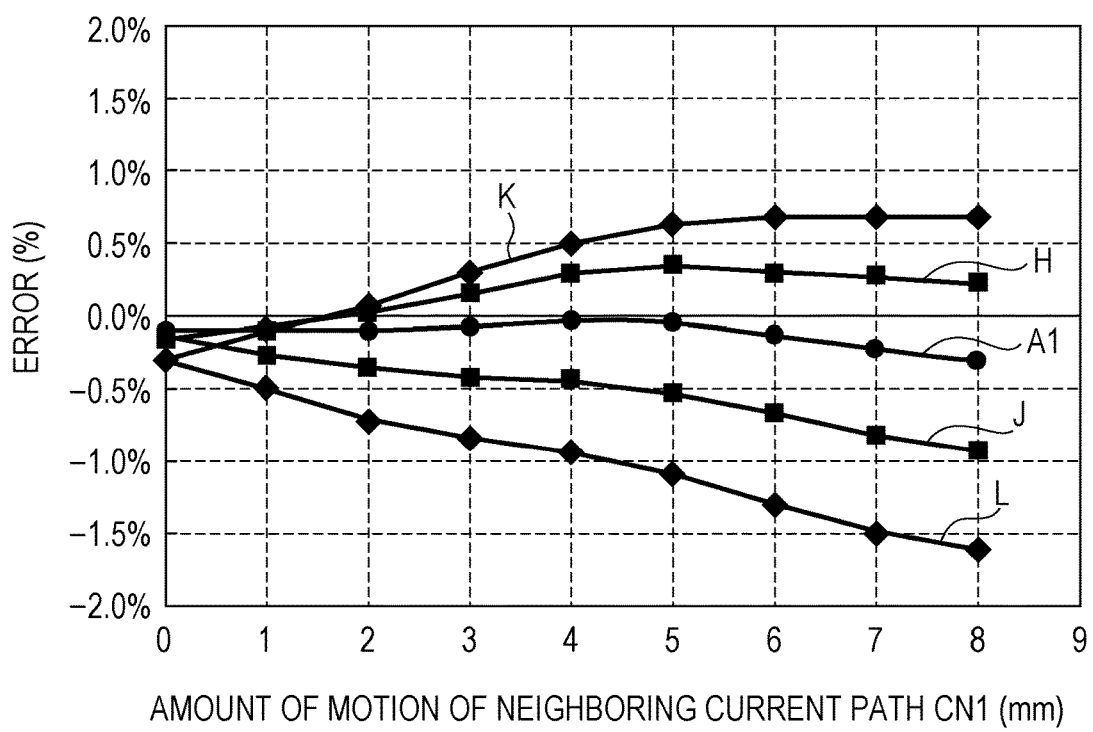
FIG. 7 is a graph indicating calculation results about the current sensor according to the first embodiment.

The model in FIG. 4 was modified and verification was also performed for a case in which the orientations SJ of the sensitivity axes of the plurality of pairs of magneto-electric conversion elements 15 that are symmetrical with respect to the positioning position PP of the to-be-measured current path CB do not become parallel. FIG. 7 is a graph indicating calculation results about the current sensor 101 according to the first embodiment of the present invention. To use changed values in calculations, the angle formed by each pair of magneto-electric conversion elements 15 that were point-symmetrically placed was shifted 5 degrees in the clockwise direction and 5 degrees in the counterclockwise direction from 180 degrees (H and J in FIG. 7) and was also shifted 10 degrees in the clockwise direction and 10 degrees in the counterclockwise direction from (K and L in FIG. 7).

Calculation results indicate that, as indicated in FIG. 7, error in all modified cases is larger than error of the output values from the magneto-electric conversion elements 15 in the current sensor 101 in the present invention (A1 in FIG. 7). Error is larger when the orientations SJ of the sensitivity axes were less parallel, that is, when a shift of 10 degrees was made (K and L in FIG. 7). Unlike the results indicated in FIGS. 6A and 6B in which the placement was not line-symmetric, even if the amount of motion of the neighboring current path CN1 is large, error in output values is not small Therefore, it can be said that it is more preferable for the orientations SJ of the sensitivity axes of the plurality of pairs of magneto-electric conversion elements 15 that are symmetrical with respect to the positioning position PP of the to-be-measured current path CB to be parallel.

As described above, in the current sensor 101 according to the first embodiment of the present invention, the first magneto-electric conversion element group A15 and second magneto-electric conversion element group B15 are symmetrically positioned with respect to the first virtual line IL1 on the printed circuit board 16 having the cut 17, into which the to-be-measured current path CB is inserted and at which it is positioned, so as to interpose the cut 17 therebetween. Therefore, a space in which the magneto-electric conversion elements 15 are positioned can be reduced in the direction of the second virtual line, in spite of the placement of the magneto-electric conversion elements 15 into which the to-be-measured current path CB is inserted and positioned, when compared with a case in which the magneto-electric conversion elements C35 are positioned on a circumference so as to be equally spaced. Specifically, in the placement of the magneto-electric conversion elements 15 according to this embodiment, the first magneto-electric conversion element group A15 and second magneto-electric conversion element group B15 are positioned so as to interpose the first virtual line IL1 therebetween, the first virtual line IL1 passing through the positioning position PP of the to-be-measured current path CB and extending in a direction in which the cut 17 is formed, and so as to be located along the first virtual line IL1. Therefore, if the spacing between the first magneto-electric conversion element group A15 and the second magneto-electric conversion element group B15 (inter-group spacing DG1) is large enough for the portion of the to-be-measured current path CB with the maximum diameter to pass through, the inter-element spacing DA1 can be made smaller than the inter-group spacing DG1, the inter-element spacing DA1 being between each adjacent two of the magneto-electric conversion elements 15 constituting the first magneto-electric conversion element group A15 and between each adjacent two of the magneto-electric conversion elements 15 constituting the second magneto-electric conversion element group B15. Therefore, the area in which the magneto-electric conversion elements 15 are positioned can be made small, particularly in a direction orthogonal to the direction in which the cut 17 is formed (in a direction in which the second virtual line IL2 extends), so the printed circuit board 16 can be made compact. In addition, since the inter-element spacing DA1 between each two adjacent magneto-electric conversion elements 15 in the first magneto-electric conversion element group A15 and in the second magneto-electric conversion element group B15 is narrower than the inter-group spacing DG1 between the first magneto-electric conversion element group A15 and the second magneto-electric conversion element group B15, the inter-element spacing DA1 between each two adjacent magneto-electric conversion elements 15 can be narrowed in the same magneto-electric conversion element group when compared with a case in which the magneto-electric conversion elements C35 are placed on a circumference so as to be equally spaced. Thus, adverse effects by external magnetic fields from other current paths positioned at positions adjacent to the to-be-measured current path CB can be reduced, so adverse effect on the magneto-electric conversion elements 15 by the external magnetic fields can be reduced. So, it is possible to allocate a space into which the to-be-measured current path CB is inserted and at which it is positioned, to make the current sensor 101 compact, and to obtain stable detected values from the magneto-electric conversion elements 15. As a result, it is possible to provide the current sensor 101 that can be made compact and from which stable detected values can be obtained.

Since the semi-major axis IE1a of the virtual ellipse IE1, on which the magneto-electric conversion elements 15 are placed, is located on the cut 17, it is possible to insert the to-be-measured current path CB into the cut 17 along the semi-major axis IE1a and position it therein. Therefore, the outer size of the to-be-measured current path CB and inter-group spacing DG1 can be made as close to each other as possible, so the magneto-electric conversion elements 15 can be positioned as close to the to-be-measured current path CB as possible. Therefore, it is possible to achieve a greater reduction in adverse effects by external magnetic fields from other current paths positioned at positions adjacent to the to-be-measured current path CB and thereby achieve a greater reduction in adverse effects on the magneto-electric conversion elements 15 by the external magnetic fields. Accordingly, the current sensor 101 can be made more compact and more stable detected values can be obtained from the magneto-electric conversion elements 15.

The direction of the sensitivity axis of each magneto-electric conversion element 15 is parallel to the first virtual line IL1 or second virtual line IL2. Accordingly, each magneto-electric conversion element 15 can be easily mounted on the printed circuit board 16 and positional relationships between the magneto-electric conversion elements 15 and the printed circuit board 16 can be easily designed when compared with a case in which the magneto-electric conversion element C35 are positioned on a circumference so as to be equally spaced. Therefore, precision for, for example, the installation angle and installation position of the to-be-measured current path CB can be increased, so measurement precision can be improved.

Since the number of magneto-electric conversion elements 15 is preferably 8, the inter-element spacing DA1 between each two adjacent magneto-electric conversion elements 15 can be made narrower when compared with a case in which six magneto-electric conversion elements 15 are used. Therefore, it is possible to improve the measurement precision of the current sensor 101 and reduce adverse effects by external magnetic fields from other current paths positioned at positions adjacent to the to-be-measured current path CB. Thus, adverse effects on the magneto-electric conversion elements 15 by the external magnetic fields can be reduced and more stable detected values can be obtained from the magneto-electric conversion elements 15.

When the magneto-electric conversion elements 15a to 15h of the current sensor 101 are mounted on the printed circuit board 16 so that their sensitivity affecting axes are oriented as illustrated in FIGS. 3 and 8 and values detected by each pair of magneto-electric conversion elements 15 at point-symmetrical positions are processed so that components due to induced magnetic fields applied from the directions of the sensitivity affecting axes are offset, adverse effects on measurement precision by the magnetic fields in the directions of the sensitivity affecting axes can be suppressed. This can prevent a measurement precision drop attributable to the sensitivity affecting axis.

Second embodiment

Figure 9:
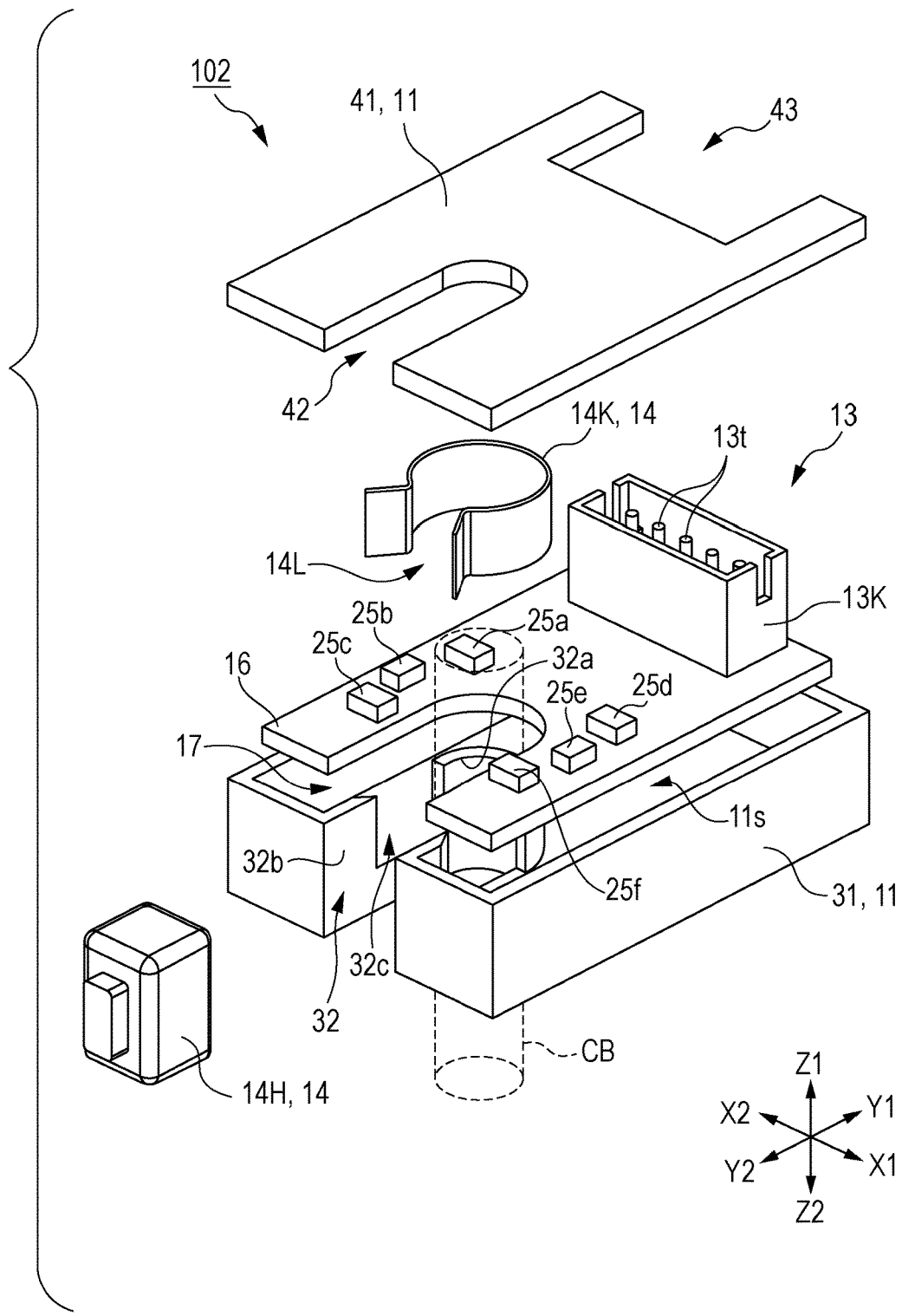
FIG. 9 is an exploded perspective view illustrating a current sensor according to a second embodiment of the present invention.
Figure 10:
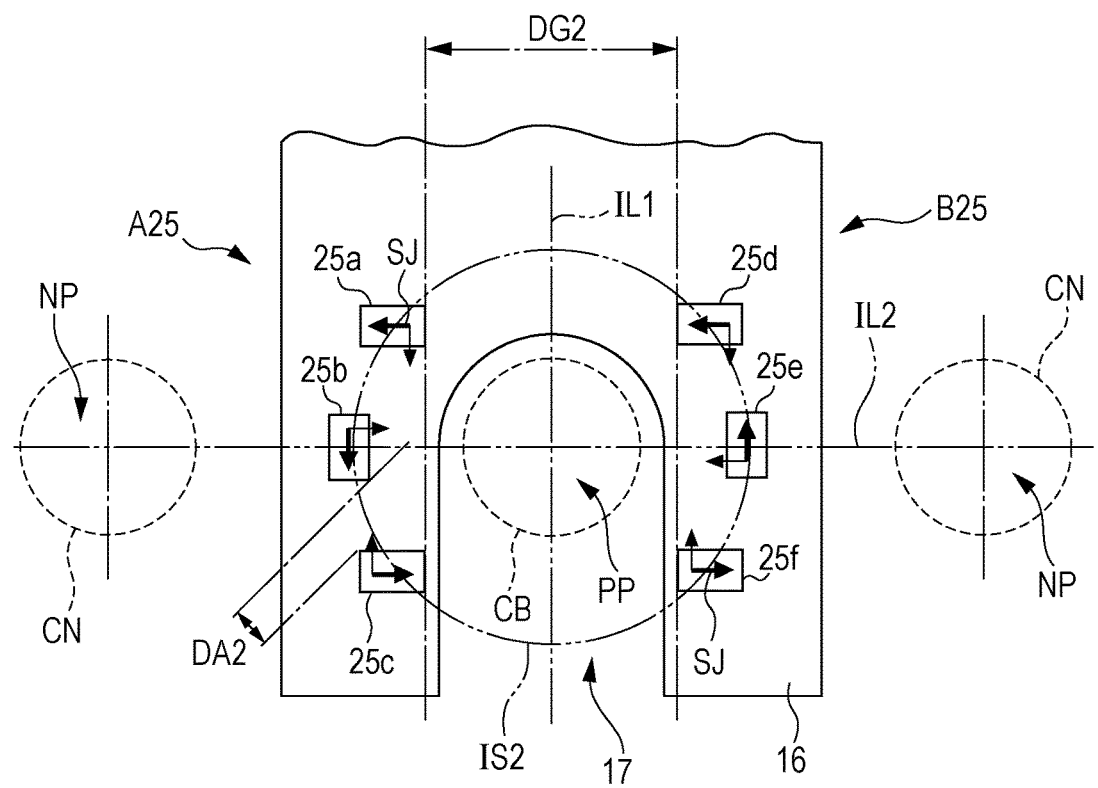
FIG. 10 is a drawing illustrating the current sensor according to the second embodiment, indicating a top view of the printed circuit board when viewed from the same side as Z1 in FIG. 9.
Figure 15:
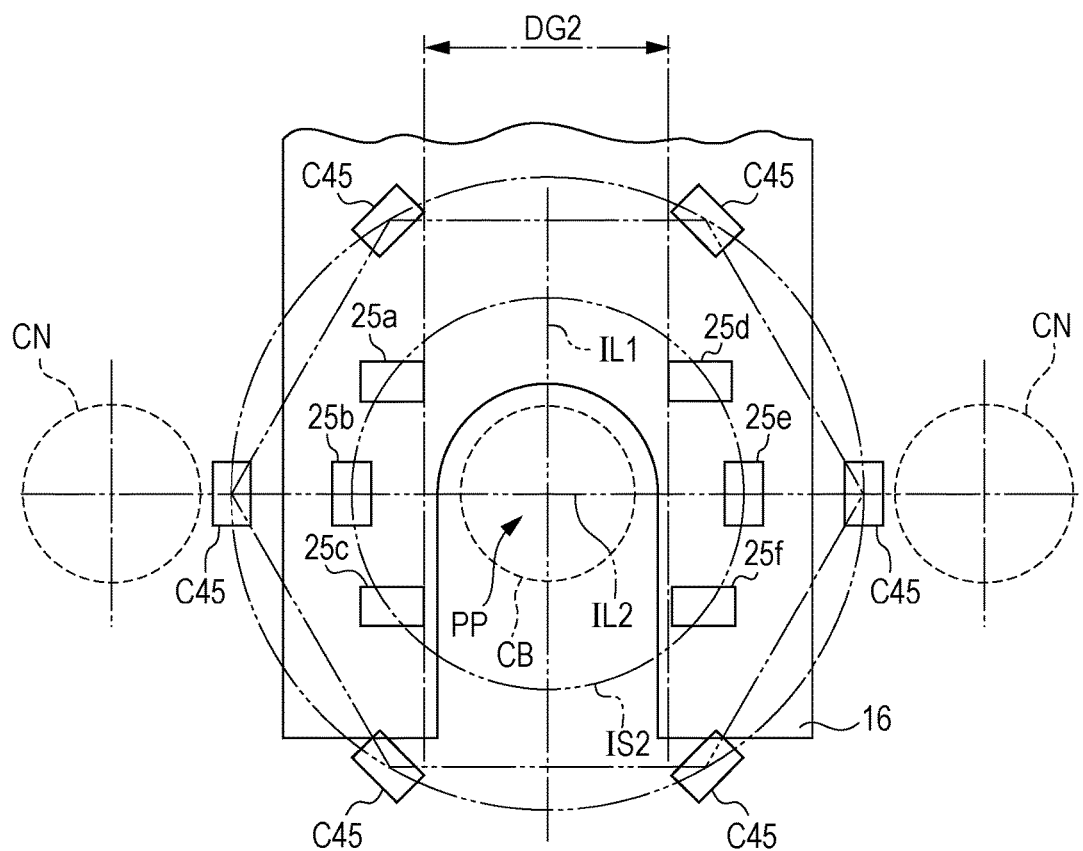
FIG. 15 is a drawing illustrating a comparative example compared with the current sensor according to the second embodiment of the present invention, illustrating a placement of magneto-electric conversion elements according to a fourth comparative example, which are compared with the magneto-electric conversion elements in FIG. 10.

FIG. 9 is an exploded perspective view illustrating a current sensor 102 according to a second embodiment of the present invention. FIG. 10 is a drawing illustrating the current sensor 102 according to the second embodiment, indicating a top view of the printed circuit board 16 when viewed from the same side as Z1 in FIG. 9. FIG. 15 is a drawing illustrating a comparative example compared with the current sensor 102 according to the second embodiment of the present invention, illustrating a placement of magneto-electric conversion elements according to a fourth comparative example, which are compared with the placement of the magneto-electric conversion elements 25 in FIG. 10. The current sensor 102 according to the second embodiment differs from the first embodiment in positions at which the magneto-electric conversion elements 25 are positioned. Component elements that are the same as in the first embodiment will be given the same reference characters and their detailed descriptions will be omitted, and the positions at which the magneto-electric conversion elements 25 are positioned will be described in detail.

As illustrated in FIG. 9, the current sensor 102 according to the second embodiment of the present invention includes a printed circuit board 16 and a plurality of magneto-electric conversion elements 25 that detect a magnetism generated when a current flows in the to-be-measured current path CB, the magneto-electric conversion elements 25 being placed on the printed circuit board 16. The current sensor 102 also includes the case 11 having the accommodating part 11s in which the printed circuit board 16 is accommodated, the connector 13 having the terminals 13t from which electric signals are retrieved from the magneto-electric conversion elements 25, and the retaining member 14 that secures the to-be-measured current path CB and retains it.

The magneto-electric conversion element 25 is a current sensor element that detects a magnetism that is generated when a current flows in the to-be-measured current path CB. A magneto-electric conversion element using a giant magneto-resistive effect element (referred to as a giant magneto-resistive (GMR) element), for example, can be used, as in the first embodiment. Although details of the magneto-electric conversion element 25 are not illustrated to simplify its explanation, the magneto-electric conversion element 25 is formed by manufacturing a GMR element on a silicon substrate, packaging a cut-out chip with a thermosetting synthetic resin, and electrically connecting lead terminals, which are used to retrieve signals, to the GMR element. The lead terminals are soldered to the printed circuit board 16.

As illustrated in FIG. 10, the magneto-electric conversion elements 25 are divided into a first magneto-electric conversion element group A25, including half of them (in this embodiment, three magneto-electric conversion elements 25), and a second magneto-electric conversion element group B25, including the remaining half (in this embodiment, three magneto-electric conversion elements 25). The first magneto-electric conversion element group A25 and second magneto-electric conversion element group B25 are positioned so as to interpose the cut 17 therebetween. That is, the magneto-electric conversion elements 25 constitute the first magneto-electric conversion element group A25 and second magneto-electric conversion element group B25, each of which includes the same number of magneto-electric conversion elements, and the first magneto-electric conversion element group A25 and second magneto-electric conversion element group B25 are oppositely disposed so as to interpose the cut 17 therebetween.

The first magneto-electric conversion element group A25 and second magneto-electric conversion element group B25 are symmetrically positioned with respect to the first virtual line IL1. The three magneto-electric conversion elements 25 in the first magneto-electric conversion element group A25 are symmetrically positioned with respect to the second virtual line IL2, and the three magneto-electric conversion elements 25 in the second magneto-electric conversion element group B25 are also symmetrically positioned with respect to the second virtual line IL2. When the to-be-measured current path CB is placed in the cut 17 in the printed circuit board 16, the first virtual line IL1 and second virtual line IL2 are orthogonal to each other at the positioning position PP at which the to-be-measured current path CB is positioned. That is, the first magneto-electric conversion element group A25 and second magneto-electric conversion element group B25 are positioned so as to interpose the first virtual line IL1 therebetween, the first virtual line IL1 passing through the positioning position PP of the to-be-measured current path CB and extending in a direction in which the cut 17 is formed, and so as to be placed along the first virtual line IL1. Magneto-electric conversion elements 25a to 25c constituting the first magneto-electric conversion element group A25 and magneto-electric conversion elements 25d to 25f constituting the second magneto-electric conversion element group B25 are symmetrically positioned with respect to the second virtual line IL2 that is orthogonal to the first virtual line IL1 at the positioning position PP of the to-be-measured current path CB. Thus, a space in which the magneto-electric conversion elements 25 are positioned can be reduced in the direction of the second virtual line, in spite of the placement of the magneto-electric conversion elements 25 with the to-be-measured current path CB inserted and positioned, when compared with a case (fourth comparative example) in which magneto-electric conversion elements C45 are positioned on a circumference so as to be equally spaced as illustrated in FIG. 15. Specifically, in the fourth comparative example in which the magneto-electric conversion elements C45 are used, they are placed on a circumference centered on the position at which the to-be-measured current path CB is positioned, so as to be equally spaced. Therefore, when the to-be-measured current path CB is inserted from between magneto-electric conversion elements C45 and is positioned at the positioning position, an inter-element spacing between each two magneto-electric conversion elements C45 needs to be large enough for at least the to-be-measured current path CB to pass through, requiring a large area in order to position all magneto-electric conversion elements C45. This needs the printed circuit board to be enlarged. By contrast, in the placement of the magneto-electric conversion elements 25 according to this embodiment, the first magneto-electric conversion element group A25 and second magneto-electric conversion element group B25 are positioned so as to interpose the first virtual line IL1 therebetween, the first virtual line IL1 passing through the positioning position PP of the to-be-measured current path CB and extending in a direction in which the cut 17 is formed, and so as to be located along the first virtual line IL1. That is, if an inter-group spacing DG2 between the first magneto-electric conversion element group A25 and the second magneto-electric conversion element group B25 is large enough for the portion of the to-be-measured current path CB with the maximum diameter to pass through, an inter-element spacing DA2 can be made smaller than the inter-group spacing DG2, the inter-element spacing DA2 being between each adjacent two of the magneto-electric conversion elements 25 constituting the first magneto-electric conversion element group A25 and between each adjacent two of the magneto-electric conversion elements 25 constituting the second magneto-electric conversion element group B25. Therefore, the area in which the magneto-electric conversion elements 25 are positioned can be made smaller than the area in which the magneto-electric conversion elements C45 in the fourth comparative example are positioned, particularly in a direction orthogonal to the direction in which the cut 17 is formed (in a direction in which the second virtual line IL2 extends), so the printed circuit board 16 can be made compact, that is, the whole of the current sensor 102 can be made compact. Although, in this embodiment, the first virtual line IL1 and second virtual line IL2 are orthogonal to each other at the center of the to-be-measured current path CB, this is not a limitation; they need only to be orthogonal to each other at least at the positioning position PP of the to-be-measured current path CB.

As illustrated in FIG. 10, the spacing between the magneto-electric conversion element 25 at the farthest end in the first magneto-electric conversion element group A25 and the magneto-electric conversion element 25 at the farthest end in the second magneto-electric conversion element group B25 is preferably the inter-group spacing DG2, which is the narrowest spacing between the first magneto-electric conversion element group A25 and the second magneto-electric conversion element group B25, and the spacing between the magneto-electric conversion element 25 positioned at the position closest to the second virtual line IL2 in the first magneto-electric conversion element group A25 and the magneto-electric conversion element 25 positioned at the position closest to the second virtual line IL2 in the second magneto-electric conversion element group B25 is preferably widest. The inter-element spacing DA2, which is the spacing between each two adjacent magneto-electric conversion elements 25 in the first magneto-electric conversion element group A25 and in the second magneto-electric conversion element group B25 is narrower than the inter-group spacing DG2, which is the narrowest spacing between the first magneto-electric conversion element group A25 and the second magneto-electric conversion element group B25. That is, the inter-element spacing DA2 between each adjacent two of the magneto-electric conversion elements 25 constituting the first magneto-electric conversion element group A25 in the direction in which the first virtual line IL1 extends and between each adjacent two of the magneto-electric conversion elements 25 constituting the second magneto-electric conversion element group B25 in the direction in which the first virtual line IL1 extends is made smaller than the inter-group spacing DG2 between the first magneto-electric conversion element group A25 and the second magneto-electric conversion element group B25, which interpose the first virtual line IL1 therebetween, the first virtual line IL1 passing through the cut 17; the magneto-electric conversion elements 25 are placed so that some inter-element spacings DA2 are made to differ, instead of making all inter-element spacings DA2 of the magneto-electric conversion elements 25 (25a to 25f) the same. Thus, the inter-element spacing DA2 between each two adjacent magneto-electric conversion elements 25 can be narrowed in the same magneto-electric conversion element group, in spite of the placement of the magneto-electric conversion elements 25 with the to-be-measured current path CB inserted and positioned, when compared with a case (fourth comparative example) in which magneto-electric conversion elements C45 are positioned on a circumference so as to be equally spaced as illustrated in FIG. 15. Therefore, adverse effects by external magnetic fields from the neighboring current paths CN at positions adjacent to the to-be-measured current path CB can be reduced. Since the adverse effects on the magneto-electric conversion elements 25 by the external magnetic fields are reduced, stable detected values can be obtained from the magneto-electric conversion elements 25.

Furthermore, as illustrated in FIG. 10, the magneto-electric conversion elements 25 are positioned on a virtual circle IS2 centered on the positioning position PP of the to-be-measured current path CB. Thus, the to-be-measured current path CB can be inserted into the cut 17 along the radius (in the second example, first virtual line IL1) of the virtual circle IS2 disposed between the first magneto-electric conversion element group A25 and the second magneto-electric conversion element group B25 and is positioned therein, so the external dimension of the to-be-measured current path CB and the inter-group spacing DG2 can be made as close to each other as possible. This makes it possible for the magneto-electric conversion elements 25 to be positioned as close to the to-be-measured current path CB as possible, so adverse effects by external magnetic fields from the neighboring current paths CN at positions adjacent to the to-be-measured current path CB can be further reduced. As a result, since adverse effects on the magneto-electric conversion elements 25 by the external magnetic fields are further reduced, more stable detected values can be obtained from the magneto-electric conversion elements 25.

When the to-be-measured current path CB is placed in the cut 17 formed in the printed circuit board 16, the magneto-electric conversion elements 25 are positioned so that the orientations SJ of the sensitivity axes (directions in which a magnetism is detected) of the GMR elements in each of a plurality of pairs of magneto-electric conversion elements 25 that are symmetrical with respect to the positioning position PP of the to-be-measured current path CB become parallel. That is, the magneto-electric conversion elements 25 are positioned so that the directions of the sensitivity axes of each pair of magneto-electric conversion elements 25 at positions that are symmetrical with respect to the positioning position PP of the to-be-measured current path CB (for example, magneto-electric conversion element 25a and magneto-electric conversion element 25f) become parallel. Although, in this embodiment, the orientations SJ of the sensitivity axes of each pair of magneto-electric conversion elements 25 at positions that are symmetrical with respect to the positioning position PP of the to-be-measured current path CB (for example, magneto-electric conversion element 25a and magneto-electric conversion element 25f) are in opposite directions (that is, the directions of the sensitive axes are parallel and the orientations of the sensitive axes are in opposite directions), if the directions of the sensitive axes are parallel, the orientations of the sensitive axes may be in the same direction as in the first embodiment described above. If the orientations of the sensitivity axes are parallel and in the same directions, it is only necessary to invert a sign in calculation processing performed in a subsequent calculation circuit.

As illustrated in FIG. 10, the direction of the sensitivity axis of each magneto-electric conversion element 25 (in FIG. 10, orientation SJ of the sensitivity axis) is parallel to the first virtual line IL1 or second virtual line IL2. Accordingly, each magneto-electric conversion element 25 can be easily mounted on the printed circuit board 16 and positional relationships between the magneto-electric conversion elements 25 and the printed circuit board 16 can be easily designed when compared with a case (fourth comparative example) in which magneto-electric conversion elements C45 are positioned on a circumference so as to be equally spaced as illustrated in FIG. 15. Therefore, precision for, for example, the installation angle and installation position of the to-be-measured current path CB can be increased, so measurement precision can be improved.

As illustrated in FIG. 10, in this embodiment, the neighboring current paths CN are preferably positioned at positions adjacent to the to-be-measured current path CB, and the centers of the neighboring positioning positions NP at which the neighboring current paths CN are positioned are preferably located along the second virtual line IL2. Therefore, each neighboring current path CN is positioned outside the first magneto-electric conversion element group A25 or second magneto-electric conversion element group B25, so the neighboring current path CN is positioned outside the inter-element spacing DA2, which is narrower than the inter-group spacing DG2. Thus, it is possible to achieve an even greater reduction in adverse effects by external magnetic fields from the neighboring current paths CN and thereby achieve an even greater reduction in adverse effects on the magneto-electric conversion elements 25 by the external magnetic fields. Accordingly, even more stable detected values can be obtained from the magneto-electric conversion elements 25.

As illustrated in FIG. 10, each magneto-electric conversion element 25 (one of magneto-electric conversion elements 25a to 25f) is preferably mounted on the printed circuit board 16 so that its sensitivity axis and sensitivity affecting axis become parallel to the printed circuit board 16. An angle formed by the sensitivity axis and sensitivity affecting axis (sensitivity changing axis) of each magneto-electric conversion element 25 (one of magneto-electric conversion elements 25a to 25f) is the same. In the example illustrated in FIG. 10, the sensitivity affecting axes of all magneto-electric conversion elements 25 (25a to 25f) is angled about 90 degrees in the counterclockwise direction with respect to the sensitivity axis.

In the example illustrated in FIG. 10, the orientations of the sensitivity axes of each pair of magneto-electric conversion elements 25 (a pair among magneto-electric conversion elements 25a to 25f) at positions that are symmetrical with respect to the positioning position PP are in opposite directions and the orientations of their sensitivity affecting axes are also in opposite directions.

When the magneto-electric conversion elements 25a to 25f are placed so that their sensitivity affecting axes are oriented as illustrated in FIG. 10 and values detected by each pair of magneto-electric conversion elements 25 at point-symmetrical positions are processed so that components due to induced magnetic fields applied from the directions of the sensitivity affecting axes are offset, adverse effects on measurement precision by the magnetic fields in the directions of the sensitivity affecting axes can be suppressed. This can prevent a measurement precision drop attributable to the sensitivity affecting axis.

In the example in FIG. 10, if the orientations of the sensitivity affecting axes of each pair of magneto-electric conversion elements 25 (a pair among magneto-electric conversion elements 25a to 25f) at positions that are symmetrical with respect to the positioning position PP are in opposite directions, the orientations of the sensitivity affecting axes of the magneto-electric conversion elements 25a to 25f are not limited to the orientations illustrated in FIG. 10.

Figure 11:
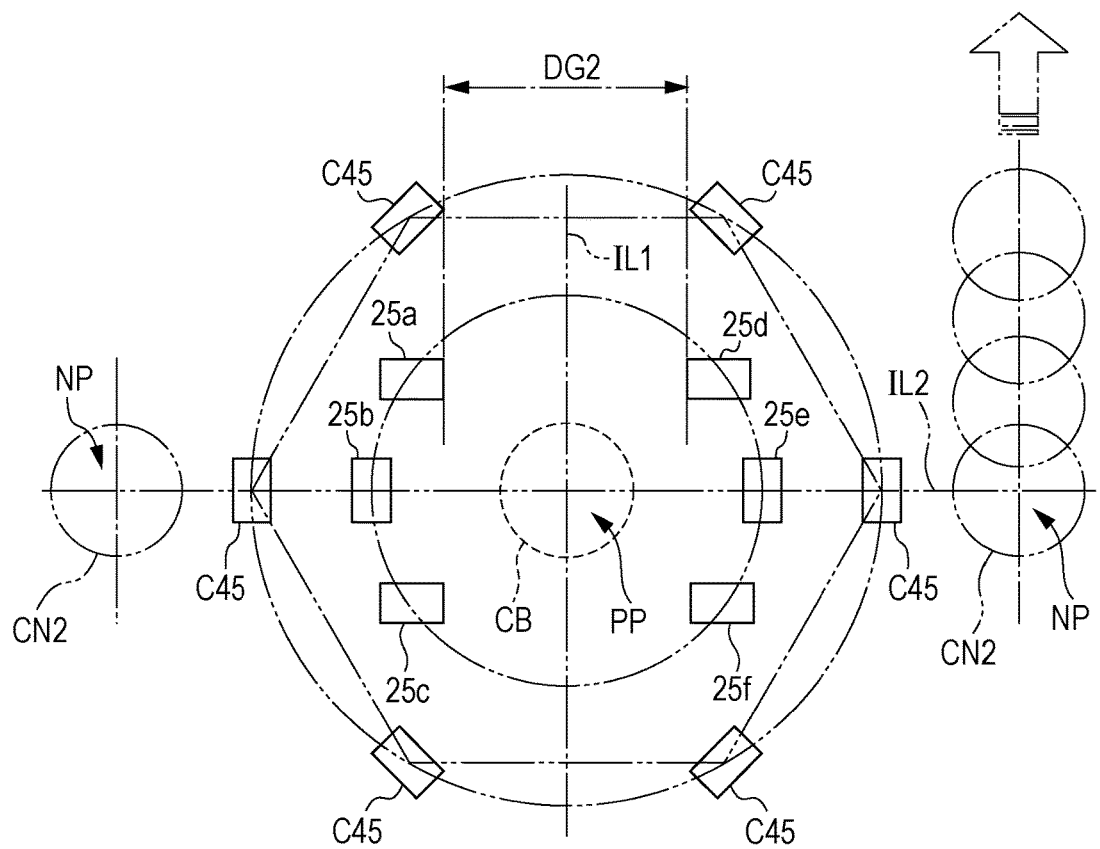
FIG. 11 is a drawing reference to explain calculation results about the current sensor according to the second embodiment, illustrating a model used in the calculation.
Figure 12:
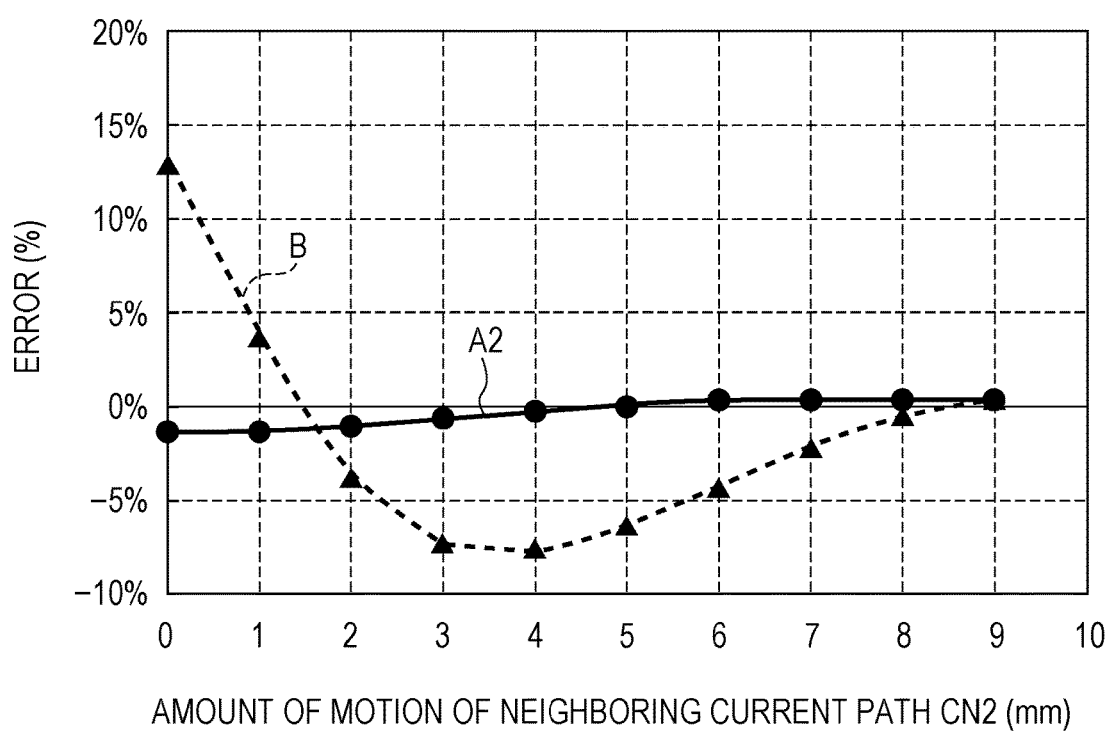
FIG. 12 is a graph indicating calculation results about the current sensor according to the second embodiment.
Figure 13A:
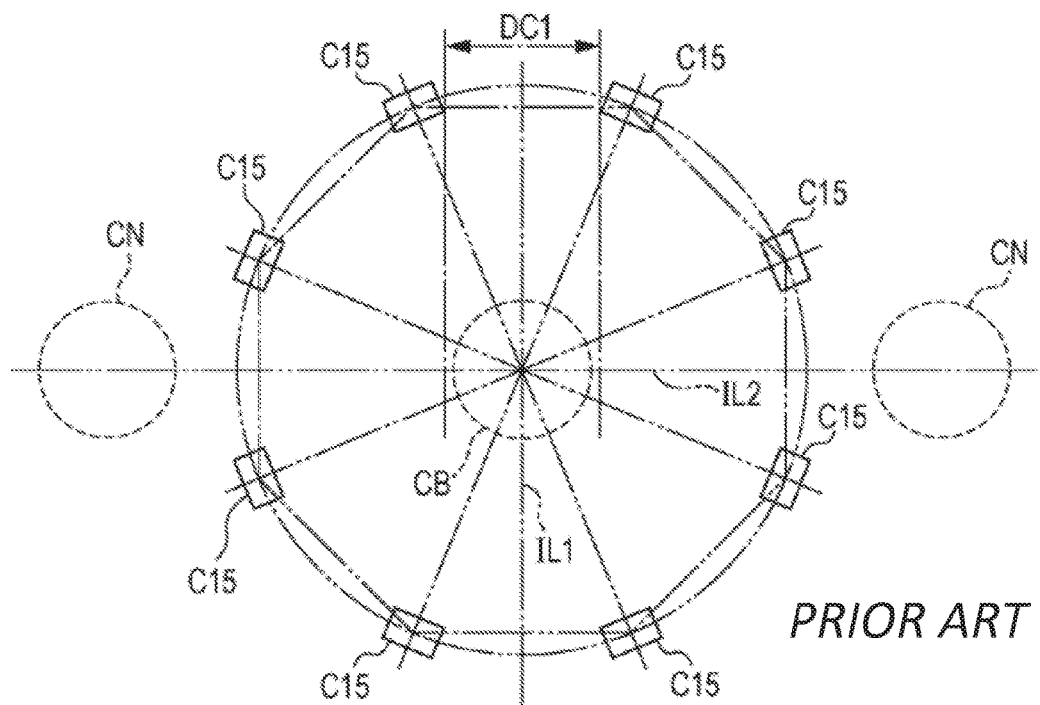
FIG. 13A is a drawing illustrating a current sensor in a first comparative example, indicating a plan view of the current sensor in which eight magneto-electric conversion elements are positioned at positions at which the magneto-electric conversion elements surround a to-be-measured current path.
Figure 13B:
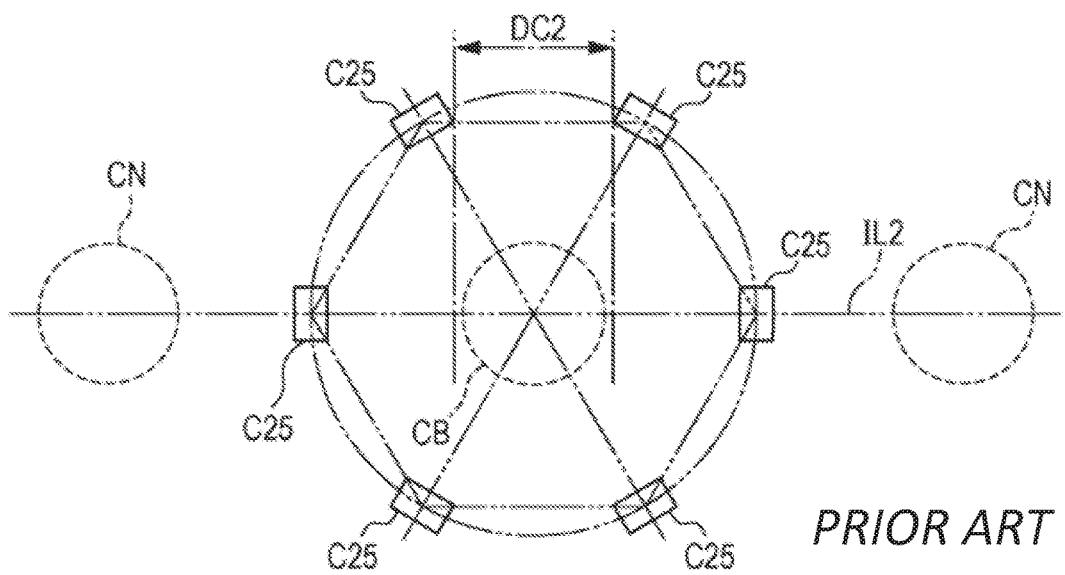
FIG. 13B is a drawing illustrating a current sensor in a second comparative example, indicating a plan view of the current sensor in which six magneto-electric conversion elements are positioned at positions at which the magneto-electric conversion elements surround a to-be-measured current path.

Next, calculations were performed by using the Biot-Savart law for the current sensor 102 according to the second embodiment of the present invention, and effects were verified. FIG. 11 is a drawing referenced to explain calculation results about the current sensor 102 according to the second embodiment of the present invention, illustrating a model used in the calculations. FIG. 11 illustrates the elliptical placement of the magneto-electric conversion elements 25 in the current sensor 102 according to the second embodiment of the present invention and the regular hexagonal placement of the magneto-electric conversion elements C45 in the fourth comparative example. In FIG. 11, a neighboring current path CN2 slightly shifts in the Y1 direction. FIG. 12 is a graph indicating calculation results about the current sensor 102 according to the second embodiment of the present invention. The horizontal axis indicates the amount of motion of the neighboring current path CN2 in the Y1 direction. The vertical axis indicates error from the true values of output values obtained from the magneto-electric conversion element 25 of the current sensor 102 and from the magneto-electric conversion element C45 in the fourth comparative example.

The values used in the calculations were as follows: the inter-group spacing DG2 of the magneto-electric conversion elements 25 is 7 mm, the distances from the first virtual line IL1 to the magneto-electric conversion elements 25 are 4 mm and 3.5 mm, and the distances from the second virtual line IL2 to the magneto-electric conversion elements 25 are 2 mm. The magneto-electric conversion elements C45 in the fourth comparative example were placed so that the inter-element spacing of the magneto-electric conversion elements C45 matches the inter-group spacing DG2 (7 mm) of the magneto-electric conversion elements 25 and the center of each magneto-electric conversion element C45 is aligned to a vertex of a regular hexagon. In a case in which the amount of motion of the neighboring current path CN2 is 0, the center of the positioning position PP of the to-be-measured current path CB and the centers of the neighboring positioning positions NP of the neighboring current paths CN2 positioned at positions adjacent to the to-be-measured current path CB are located along the second virtual line IL2. The distance between the center of the positioning position PP of the to-be-measured current path CB and the center of the neighboring positioning position NP of each neighboring current path CN2 is 10 mm.

As illustrated in FIG. 12, calculation results indicate that error (indicated by A1 in FIG. 12) of the output values from the magneto-electric conversion elements 25 in the current sensor 102 in the present invention is extremely small values when compared with error (indicated by B in FIG. 12) of the output values from the magneto-electric conversion elements C45 in the fourth comparative example. Stable output values (value with less error) were also obtained even if the position of the neighboring current path CN2 changes. Thus, it can be said that the current sensor 102 in the second embodiment of the present invention can reduce adverse effects by external magnetic fields from other current paths (neighboring current paths CN2) positioned at positions adjacent to the to-be-measured current path CB and can thereby reduce adverse effects on the magneto-electric conversion elements 25 by the external magnetic fields.

As described above, in the current sensor 102 according to the second embodiment of the present invention, the first magneto-electric conversion element group A25 and second magneto-electric conversion element group B25 are symmetrically positioned with respect to the first virtual line IL1 on the printed circuit board 16 having the cut 17, into which the to-be-measured current path CB is inserted and at which it is positioned, so as to interpose the cut 17 therebetween.

Therefore, a space in which the magneto-electric conversion elements 25 are positioned can be reduced in the direction of the second virtual line, in spite of the placement of the magneto-electric conversion elements 25 into which the to-be-measured current path CB is inserted and positioned, when compared with a case in which the magneto-electric conversion elements C45 are positioned on a circumference so as to be equally spaced. Specifically, in the placement of the magneto-electric conversion elements 25 according to this embodiment, the first magneto-electric conversion element group A25 and second magneto-electric conversion element group B25 are positioned so as to interpose the first virtual line IL1 therebetween, the first virtual line IL1 passing through the positioning position PP of the to-be-measured current path CB and extending in a direction in which the cut 17 is formed, and so as to be located along the first virtual line IL1. Therefore, if the spacing between the first magneto-electric conversion element group A25 and the second magneto-electric conversion element group B25 (inter-group spacing DG2) is large enough for the portion of the to-be-measured current path CB with the maximum diameter to pass through, the inter-element spacing DA2 can be made smaller than the inter-group spacing DG2, the inter-element spacing DA2 being between each adjacent two of the magneto-electric conversion elements 25 constituting the first magneto-electric conversion element group A25 and between each adjacent two of the magneto-electric conversion elements 25 constituting the second magneto-electric conversion element group B25. Therefore, the area in which the magneto-electric conversion elements 25 are positioned can be made small, particularly in a direction orthogonal to the direction in which the cut 17 is formed (in a direction in which the second virtual line IL2 extends), so the whole of the current sensor 102 can be made compact. In addition, since the inter-element spacing DA2 between each two adjacent magneto-electric conversion elements 25 in the first magneto-electric conversion element group A25 and in the second magneto-electric conversion element group B25 is narrower than the inter-group spacing DG2 between the first magneto-electric conversion element group A25 and the second magneto-electric conversion element group B25, the inter-element spacing DA2 between each two adjacent magneto-electric conversion elements 25 can be narrowed in the same magneto-electric conversion element group when compared with a case in which the magneto-electric conversion elements C45 are placed on a circumference so as to be equally spaced. Thus, adverse effects by external magnetic fields from other current paths positioned at positions adjacent to the to-be-measured current path CB can be reduced, so adverse effect on the magneto-electric conversion elements 25 by the external magnetic fields can be reduced. So, it is possible to allocate a space into which the to-be-measured current path CB is inserted and at which it is positioned, to make the current sensor 102 compact, and to obtain stable detected values from the magneto-electric conversion elements 25. As a result, it is possible to provide the current sensor 102 that can be made compact and from which stable detected values can be obtained.

The spacing between both ends of the first magneto-electric conversion element group A25 and second magneto-electric conversion element group B25 is the inter-group spacing DG2, the spacing between the magneto-electric conversion elements 25 at the positions closest to the second virtual line IL2 is widest, and all magneto-electric conversion elements 25 are placed on the virtual circle IS2. Therefore, the distance between each magneto-electric conversion element 25 and the center of the positioning position PP at which the to-be-measured current path CB is positioned can be made the same. Accordingly, even if there are variations in angle at which the current sensor 102 is attached to the to-be-measured current path CB, each magneto-electric conversion element 25 is placed between the to-be-measured current path CB and another current path adjacent to it with good balance. Therefore, it is possible to achieve a greater reduction in adverse effects by external magnetic fields from other current paths positioned at positions adjacent to the to-be-measured current path CB and thereby achieve a greater reduction in adverse effects on the magneto-electric conversion elements 25 by the external magnetic fields.

Since the number of magneto-electric conversion elements 25 is preferably 6, it is possible to form a current sensor 102 with a minimum number of magneto-electric conversion elements 25 with which sufficient precision is obtained. Thus, the cost of the current sensor 102 can be reduced and a space in which the magneto-electric conversion elements 25 are positioned can be reduced, so the current sensor 102 can be made more compact.

The to-be-measured current path CB and the neighboring current paths CN positioned at positions adjacent to the to-be-measured current path CB are preferably positioned along the second vertical line IL2, so each neighboring current path CN is positioned outside the first magneto-electric conversion element group A25 or second magneto-electric conversion element group B25. Accordingly, the neighboring current path CN is positioned outside the inter-element spacing DA2, which is smaller than the inter-group spacing DG2. Therefore, it is possible to achieve an even greater reduction in adverse effects by external magnetic fields from the neighboring current paths CN and thereby achieve an even greater reduction in adverse effects on the magneto-electric conversion elements 25 by the external magnetic fields. Accordingly, even more stable detected values can be obtained from the magneto-electric conversion elements 25.

When the magneto-electric conversion elements 25a to 25f of the current sensor 102 are mounted on the printed circuit board 16 so that their sensitivity affecting axes are oriented as illustrated in FIG. 10 and values detected by each pair of magneto-electric conversion elements 25 at point-symmetrical positions are processed so that components due to induced magnetic fields applied from the directions of the sensitivity affecting axes are offset, adverse effects on measurement precision by the magnetic fields in the directions of the sensitivity affecting axes can be suppressed. This can prevent a measurement precision drop attributable to the sensitivity affecting axis.

The present invention is not limited to the embodiments described above. For example, the present invention can also be practiced by making modifications as described below. These modifications are also included in the technical range of the present invention.

First Modification

Figure 16A:
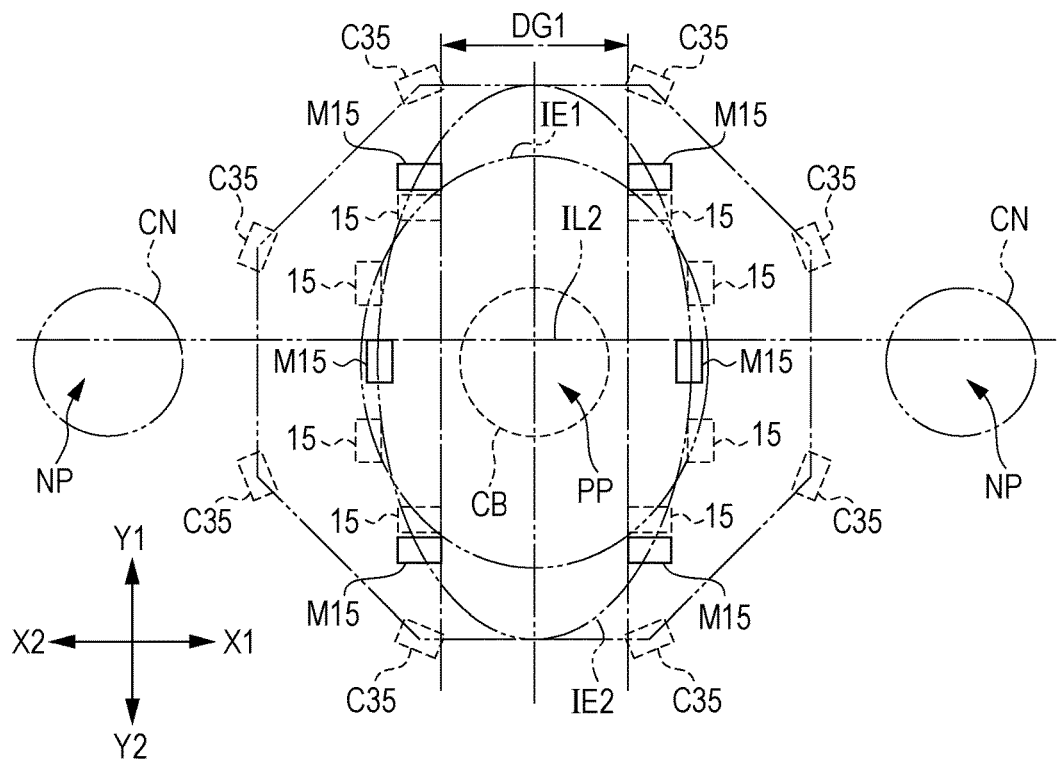
FIGS. 16A and 16B are drawings illustrating a first modification of the first embodiment of the present invention, FIG. 16A illustrating a model of a current sensor according to the first modification, which is compared with the model in FIG. 4, FIG. 16B being a graph indicating calculation results obtained from the model.
Figure 16B:
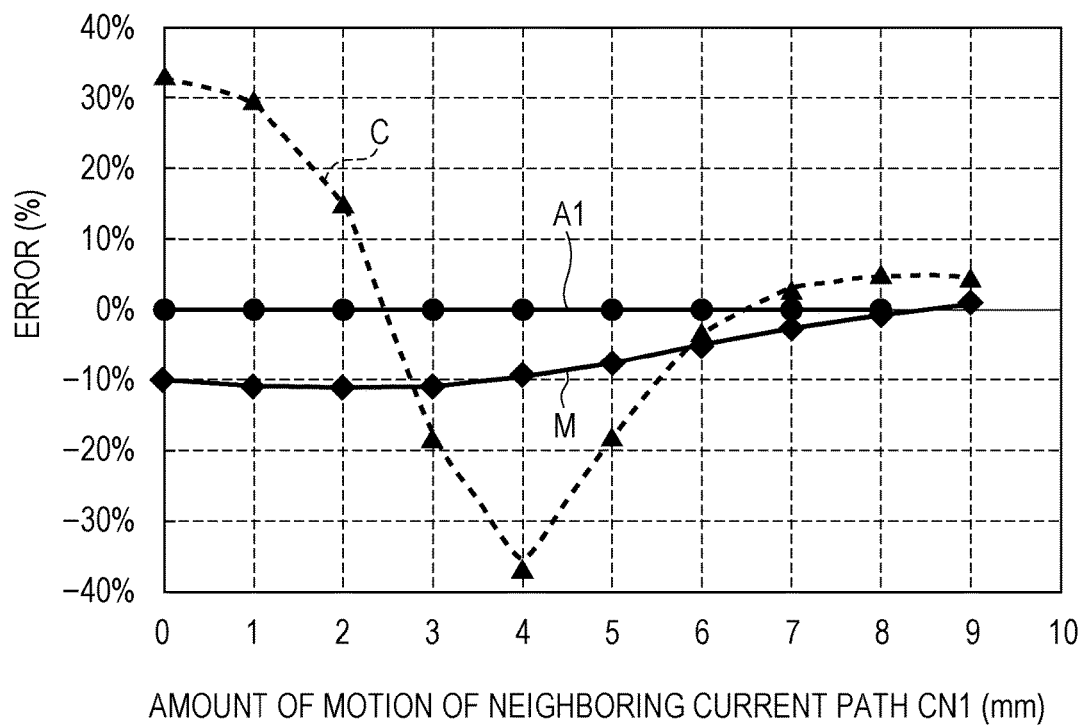

FIGS. 16A and 16B are drawings illustrating a first modification of the current sensor 101 according to the first embodiment of the present invention; FIG. 16A illustrates a model in the first modification, which is compared with the model in FIG. 4, and FIG. 16B is a graph indicating results of calculations performed by using the Biot-Savart law for the model. FIG. 16A illustrates the elliptical placement of the magneto-electric conversion elements 15 in the current sensor 101 according to the first embodiment of the present invention, the regular octagonal placement of the magneto-electric conversion elements C35 in the third comparative example, and the regular hexagonal placement of magneto-electric conversion elements M15 in the first modification by overlapping these placements. In FIG. 16B, the horizontal axis indicates the amount of motion of the neighboring current path CN1 in the Y1 direction (illustrated in FIG. 4), and the vertical axis indicates error from the true values of output values from the magneto-electric conversion elements 15 of the current sensor 101, the magneto-electric conversion element C35 in the third comparative example, and the magneto-electric conversion element M15 in the first modification. The magneto-electric conversion elements M15 in the first modification were placed so that the inter-element spacing between each two magneto-electric conversion elements M15 matches the inter-group spacing DG1 (7 mm) of the magneto-electric conversion elements 15 and that the center of each magneto-electric conversion element M15 is aligned to a vertex of a regular hexagon.

Although, in the first embodiment described above, eight magneto-electric conversion elements 15 have been placed, six magneto-electric conversion elements M15 may be placed on a virtual ellipse 1E2 as illustrated in FIG. 16A. In this case, as illustrated in FIG. 16B, error (indicated by M in FIG. 16B) of the output values from the magneto-electric conversion elements M15 in the first modification is slightly larger than error (indicated by A1 in FIG. 16B) of the output values from the magneto-electric conversion elements 15 in the first embodiment, but is extremely smaller than error (indicated by C in FIG. 16B) of output values from the magneto-electric conversion elements C35 in the third comparative example. Thus, it can be said that the first modification of the current sensor 101 according to the first embodiment of the present invention can reduce adverse effects by external magnetic fields from other current paths (neighboring current paths CN1) positioned at positions adjacent to the to-be-measured current path CB and can thereby reduce adverse effects on the magneto-electric conversion elements M15 by the external magnetic fields.

Second Modification

Although the magneto-electric conversion elements 15 have been positioned on the virtual ellipse IE1 in the first embodiment described above and the magneto-electric conversion elements 25 have been positioned on the virtual circle IS2 in the second embodiment described above, this is not a limitation; for example, magneto-electric conversion elements may be positioned on a virtual track in a quadrangular shape or in a shape with a recess at the center.

Third Modification

Although GMR elements have been preferably used as the magneto-electric conversion elements (15 or 25) in the embodiments described above, this is not a limitation; any magnetism detecting element can be used if it can detect the direction of a magnetism. The magnetism detecting element may be a magneto resistive (MR) element, an anisotropic magneto resistive (AMR) element, a tunnel magneto resistive (TMR) element, or a Hall element. However, a Hall element or the like has a different sensitive axis from a GMR element and an MR element. When using a Hall element, however, a measure is needed in its mounting according to the sensitive axis of the Hall element to be used.

The present invention is not limited to the embodiments described above. The present invention can be appropriately modified without departing from the intended scope of the present invention.

What is claimed is:

1. A current sensor comprising:
   a printed circuit board having a cutout formed along a first direction and configured to receive and place a current path at a positioning position, the cutout having a width equal to or greater than a width of the current path; and
   a plurality of magneto-electric conversion elements that detect a magnetism generated by a current to be measured flowing through the current path, each magneto-electric conversion element having:
      a sensitivity axis; and
      a sensitivity affecting axis orthogonal to the sensitivity axis, the sensitivity affecting axis affecting detection sensitivity of the sensitivity axis,
   wherein the plurality of magneto-electric conversion elements are symmetrically positioned with respect to a first virtual line that extends in the first direction and passes through the positioning position of the current path, and are also symmetrically positioned with respect to a second virtual line that is orthogonal to the first virtual line and passes through the positioning position of the current path,
   wherein the plurality of magneto-electric conversion elements are divided into a first group and a second group each including an equal number of the magneto-electric conversion elements, the first group and the second group face each other with the first virtual line interposed therebetween, such that each magneto-electric conversion element in the first group has a counterpart magneto-electric conversion element in the second group at a point-symmetric position with respect to the positioning position of the current path so as to form a point-symmetric pair,
   wherein an inter-element spacing between adjacent two of the magneto-electric conversion elements within each of the first and second groups are smaller than an inter-group spacing which is a smallest distance between one of the magneto-electric conversion elements in the first group and one of the magneto-electric conversion elements in the second group,
   wherein the sensitivity axes of the magneto-electric conversion elements located at a respective end positions of the first and second groups are parallel to the second virtual line, and the sensitivity axes of the magneto-electric conversion elements located at a position other than the respective end positions of the first and second groups are parallel to the first virtual line,
   wherein the sensitivity axes of each point symmetric pair of the magneto-electric conversion elements are parallel to each other,
   and wherein if the sensitivity axes of the point symmetric pair of the magneto-electric conversion elements are oriented in a same direction, the sensitivity affecting axes thereof are also oriented in a same direction, and if the sensitivity axes of the point symmetric pair of the magneto-electric conversion elements are oriented in opposite directions, the sensitivity affecting axes thereof are also oriented in opposite directions.

2. The current sensor according to claim 1, wherein:
   the inter-group spacing is given by a spacing between the magneto-electric conversion element at a furthest end position of the first group and the magneto-electric conversion element at a furthest end position of the second group; and
   the inter-element spacing is greatest between two of the magneto-electric conversion elements which are closest to the second virtual line within each of the first and second groups.

3. The current sensor according to claim 1, wherein the sensitivity axes and the sensitivity affecting axes are all parallel to the printed circuit board.

4. The current sensor according to claim 2, wherein the sensitivity axes and the sensitivity affecting axes are all parallel to the printed circuit board.

5. The current sensor according to claim 1, wherein a neighboring current path is provided adjacent to the current path such that a center of the neighboring current path is positioned on the second vertical line.

6. The current sensor according to claim 2, wherein a neighboring current path is provided adjacent to the current path such that a center of the neighboring current path is positioned on the second vertical line.

7. The current sensor according to claim 3, wherein a neighboring current path is provided adjacent to the current path such that a center of the neighboring current path is positioned on the second vertical line.

8. The current sensor according to claim 4, wherein a neighboring current path is provided adjacent to the current path such that a center of the neighboring current path is positioned on the second vertical line.

9. The current sensor according to claim 1, wherein the magneto-electric conversion elements are positioned on a virtual ellipse having:
   a center on the positioning position of the current path; and
   a semi-major axis on and along the cutout.

10. The current sensor according to claim 9, wherein a number of the magneto-electric conversion elements is 6.

11. The current sensor according to claim 9, wherein a number of the magneto-electric conversion elements is 8.

* * * * *